(12) United States Patent
Gharia

(10) Patent No.: US 6,760,241 B1
(45) Date of Patent: Jul. 6, 2004

(54) DYNAMIC RANDOM ACCESS MEMORY (DRAM) BASED CONTENT ADDRESSABLE MEMORY (CAM) CELL

(75) Inventor: Nilesh A. Gharia, San Jose, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/273,629

(22) Filed: Oct. 18, 2002

(51) Int. Cl.[7] .............................................. G11C 15/00
(52) U.S. Cl. .................... 365/49; 365/189.07; 365/222; 365/200
(58) Field of Search ............................ 365/49, 189.07, 365/222, 200

(56) References Cited

U.S. PATENT DOCUMENTS

| | | | |
|---|---|---|---|
| 4,780,845 A | 10/1988 | Threewitt | 365/49 |
| 4,791,606 A | 12/1988 | Threewitt et al. | 365/49 |
| 5,111,427 A | 5/1992 | Kobayashi et al. | 365/49 |
| 5,319,589 A | 6/1994 | Yamagata et al. | 365/49 |
| 5,642,320 A | 6/1997 | Jang | 365/222 |
| 5,724,296 A | 3/1998 | Jang | 365/222 |
| 6,154,384 A | 11/2000 | Nataraj et al. | 365/49 |
| 6,166,938 A | 12/2000 | Wong | 365/49 |
| 6,188,594 B1 * | 2/2001 | Ong | 365/49 |
| 6,240,003 B1 | 5/2001 | McElroy | 365/49 |
| 6,310,880 B1 | 10/2001 | Waller | |
| 6,320,777 B1 | 11/2001 | Lines et al. | 365/49 |
| 6,331,961 B1 | 12/2001 | Kengeri et al. | 365/222 |
| 6,400,593 B1 | 6/2002 | Lien et al. | 365/49 |
| 6,400,594 B2 * | 6/2002 | Hata et al. | 365/49 |
| 6,418,042 B1 | 7/2002 | Srinivasan et al. | 365/49 |
| 6,421,265 B1 * | 7/2002 | Lien et al. | 365/49 |
| 6,430,073 B1 | 8/2002 | Batson et al. | 365/49 |
| 6,442,090 B1 | 8/2002 | Ahmed et al. | 365/207 |
| 6,597,594 B2 | 7/2003 | Waller | |
| 2002/0093347 A1 | 7/2002 | Henderson | 324/678 |

* cited by examiner

*Primary Examiner*—Vu A. Le
*Assistant Examiner*—Pho M. Luu
(74) *Attorney, Agent, or Firm*—Shemwell Gregory & Courtney LLP

(57) ABSTRACT

A ternary content addressable memory (CAM) cell includes a dynamic random access memory (DRAM) cell storing data values and a DRAM cell storing mask values. The mask values control a masking circuit. The CAM cell also includes a compare circuit coupled among the DRAM cell and the masking circuit. The compare circuit of an embodiment receives data and comparand data and affects a logical state of a match line in response to a predetermined relationship between the data and comparand data. The compare circuit includes a first pair of transistors coupled for conduction state control by the comparand data and a second pair of transistors coupled for conduction state control by the data. The first pair of transistors includes two n-channel transistors. The second pair of transistors includes one n-channel and one p-channel transistor. A sense amplifier couples to the match line to detect changes in match line logical state.

21 Claims, 15 Drawing Sheets

DYNAMIC RANDOM ACCESS MEMORY (DRAM) BASED CONTENT ADDRESSABLE MEMORY (CAM) CELL

TECHNICAL FIELD

The disclosed embodiments relate generally to content addressable memory (CAM) cells.

BACKGROUND

A content addressable memory (CAM) device is a storage device that is particularly suitable for matching functions because it can be instructed to compare a specific pattern of comparand data with data stored in an associative CAM array. A CAM, also referred to as an associative memory, can include a number of data storage locations, each of which can be accessed by a corresponding address. Functionality of a CAM depends at least in part on whether the CAM includes binary or ternary CAM cells.

Typical binary CAM cells are able to store two states of information, a logic one state and a logic zero state. Binary CAM cells typically include a random access memory (RAM) cell and a compare circuit. The compare circuit compares the comparand data with data stored in the RAM cell and provides the match result to a match line. Columns of binary CAM cells may be globally masked by mask data stored in one or more global mask registers.

Ternary CAM cells are mask-per-bit CAM cells that effectively store three states of information, namely a logic one state, a logic zero state, and a don't care state for compare operations. Ternary CAM cells typically include a second RAM cell that stores local mask data for the each ternary CAM cell. The local mask data masks the comparison result of the comparand data with the data stored in the first RAM cell such that, when the mask bit has a first predetermined value (a logic low, for example) its compare operation will be masked so that the comparison result does not affect the match line (e.g., always appears to match). The ternary CAM cell offers more flexibility to the user to determine on an entry-per-entry basis which bits in a word will be masked during a compare operation.

Many typical CAM devices used static memory technology. However, dynamic memory technology including dynamic random access memory (DRAM) devices is also being used because it can provide relatively denser and, therefore, larger memory arrays on the same size chip as similar arrays using static memory technology. The efficient search capabilities of CAM devices have proven useful in many applications including address filtering and lookups in routers and networking equipment, for example, and pattern recognition for encryption and/or decryption and compression and/or decompression applications, for example, as well as other pattern recognition applications. As the applications for CAM devices increase so to do the applications for denser DRAM-based CAM cells.

Figure 1:
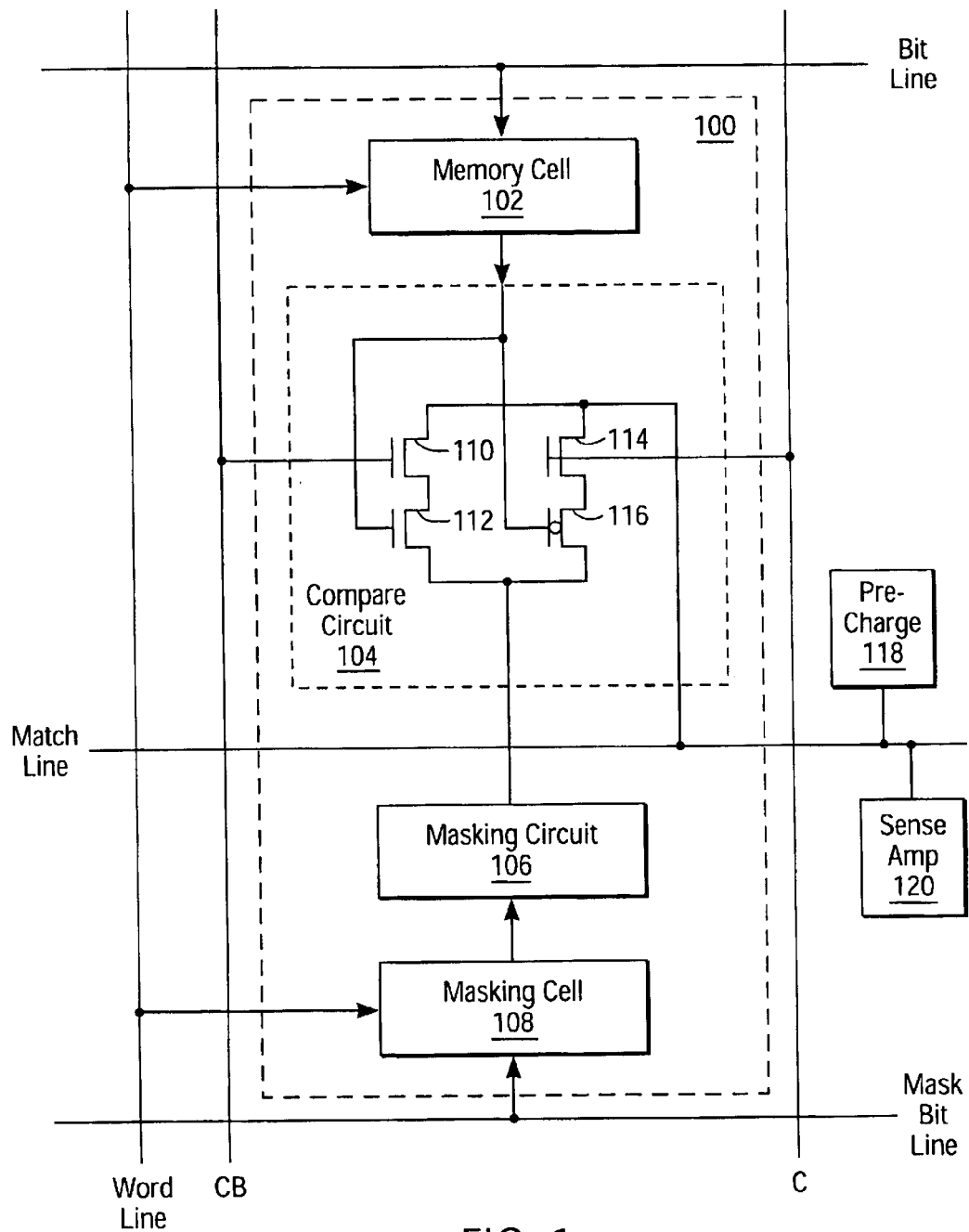
FIG. 1 is a block diagram of a ternary DRAM CAM cell that includes a compare circuit having a combination of n-channel and p-channel transistors, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 104 is first introduced and discussed with respect to FIG. 1). Any modifications necessary to the Figures can be readily made by one skilled in the relevant art based on the detailed description provided herein.

DETAILED DESCRIPTION

In the following description, for purposes of explanation, specific nomenclature is set forth and specific details are introduced to provide a thorough understanding of, and enabling description for, embodiments of the present invention. One skilled in the relevant art, however, will recognize that the present invention can be practiced without one or more of these specific details, or with other components, systems, etc. In other instances, well-known circuits, devices, structures or operations are not shown, or are not described in detail, to avoid obscuring aspects of the invention. Additionally, the interconnection between circuit elements or blocks may be shown as buses or as single signal lines. Each of the buses may alternatively be single signal lines, and each of the single signal lines may alternatively be buses. Additionally, the suffix "B" attached to signal names indicates that the signal is an active low signal. Each of the active low signals may be changed to active high signals as generally known in the art. Furthermore, the transistors of an embodiment are symmetrical devices so references to "source (drain)" and "drain (source)" are made to indicate the symmetrical nature of these couplings.

FIG. 1 is a block diagram of a ternary DRAM CAM cell 100, under an embodiment. Ternary DRAM CAM cell 100 includes memory cell 102, compare circuit 104, masking circuit 106, and masking cell 108. Memory cell 102 stores data to be compared with comparand data provided on compare signal lines C and CB. The memory cell 102 is a DRAM cell, but alternative embodiments may include any type of memory storage element, including volatile or nonvolatile memory storage elements. Data is written to and read from the memory cell 102 via the data bit line when a word line is asserted to a predetermined logic state. Alternative embodiments may write data to or read data from the memory cell 102 using any number/combination of bit lines or other data or bus lines.

Compare circuit 104 compares the data stored in the memory cell 102 with comparand data provided on compare signal lines C and CB. Compare circuit 104 includes transistors 110, 112, 114, and 116 coupled to perform the comparison function. In the compare circuit of an embodiment, transistors 110, 112, and 114 are n-channel or NMOS transistors and transistor 116 is a p-channel or PMOS transistor, but the embodiment is not so limited. Transistors 110 and 112 are coupled in series to form a first path of the compare circuit 104, and transistors 114 and 116 are coupled in series to form a second path of the compare circuit. The sources (drains) of transistors 110 and 114 are coupled to the match line, while the drains (sources) of transistors 112 and 116 are coupled to the mask circuit 106.

Regarding control inputs to each of the transistors 110–116, the gate of transistor 110 receives comparand data from compare signal line CB and the gate of transistor 114 receives comparand data from compare signal line C. The gates of transistors 112 and 116 are coupled to receive data from the memory cell 102. The sources (drains) of transistors 110 and 114 are coupled to the match line. Compare circuit 104 pulls the match line to a logic zero state when the comparand data does not match (i.e., mismatches) the data stored in the memory cell 102 and when the mask circuit 106 does not mask the comparison result.

Masking cell 108 includes a DRAM cell that stores local mask data for the ternary DRAM CAM cell 100. Alternative embodiments of the masking cell 108 may include any type of memory storage element including a volatile or nonvolatile memory storage element. The local mask data may be written to or read from the masking cell 108 via the mask bit line when the word line is asserted to a predetermined logic state. Alternative embodiments may write data to or read data from the masking cell 108 using any number/ combination of bit lines or other data or bus lines. The word line of this embodiment is shared with the memory cell 102, but is not so limited.

The local mask data of the masking cell 108 is used by the masking circuit 106 to control whether the compare result generated by compare circuit 104 as a result of the comparison between the comparand data and the data of the memory cell 102 will affect the logical state of the match line. When the local mask data indicates that the comparison should be masked, masking circuit 106 effectively disables compare circuit 104 such that the comparison results of the compare circuit 104 do not control the match line logic state. When the local mask data indicates that the comparison should not be masked, masking circuit 106 allows the comparison result generated by compare circuit 104 to control the match line logic state (assuming compare operations of other CAM cells coupled to the match line also indicate a match).

The match line couples the ternary DRAM CAM cell 100 of an embodiment to a number of other DRAM CAM cells (not shown) to form a row of a CAM device. Furthermore, the match line couples the DRAM CAM cells of the row, including DRAM CAM cell 100, to a pre-charge circuit 118. The pre-charge circuit 118 initially pre-charges the match line to a logic one state. If there is an unmasked match, masked match, or masked mismatch, the match line remains pre-charged to the logic one state. If there is an unmasked mismatch, however, compare circuit 104 couples the match line for discharge to a logic zero state (e.g., for example via masking circuit 106).

The match line also couples the DRAM CAM cells of a row, including DRAM CAM cell 100, to a sense amplifier 120. The sense amplifier 120 is also referred to as a sense amp or match detect circuit. The sense amp 120 differentially compares the match line voltage with a reference voltage. In response to this comparison, the sense amp 120 provides an output signal having one of two logic states, as described further below.

In addition to the pre-charge circuit 118 and the sense amp 120, the match line may couple each row of ternary DRAM CAM cells to a priority encoder (not shown).

The priority encoder of an embodiment determines the address, location or index of the highest priority matching entry in the CAM array, but is not so limited.

Figure 2:
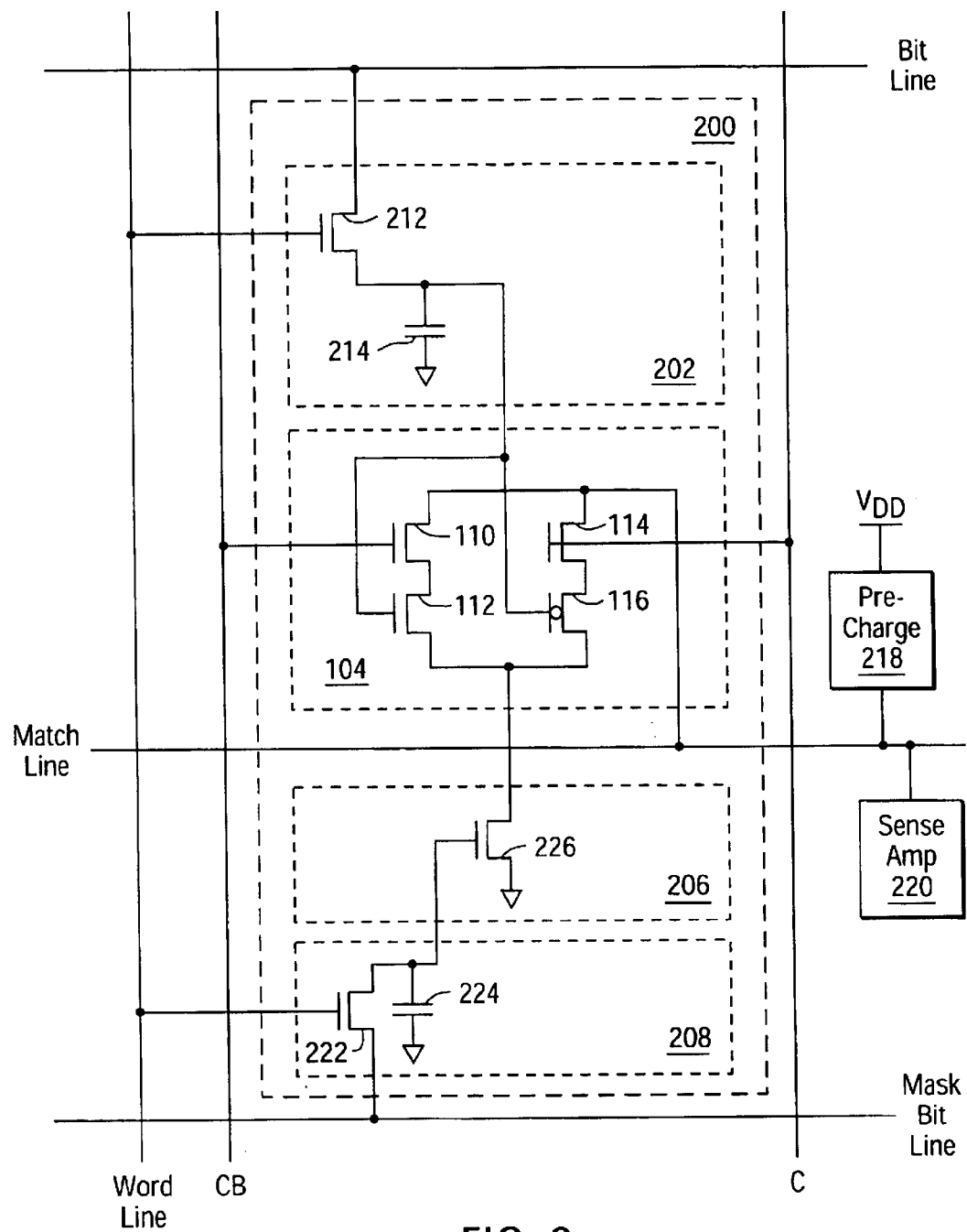
FIG. 2 is a block diagram of a ternary DRAM CAM cell, under the embodiment of FIG. 1.

FIG. 2 is a block diagram of a ternary DRAM CAM cell 200, under the embodiment of FIG. 1. Ternary DRAM CAM cell 200 includes memory cell 202, compare circuit 104, masking circuit 206, and masking cell 208. The memory cell 202, masking circuit 206, and masking cell 208 are exemplary embodiments of the memory cell 102, masking circuit 106, and masking cell 108, respectively, but are not so limited as many alternative embodiments exist for each of these circuits. The match line again couples the ternary DRAM CAM cell 200 of an embodiment to a number of other DRAM CAM cells (not shown) to form a row of a CAM device. Furthermore, the match line couples the DRAM CAM cells of the row to a pre-charge circuit 218 and a sense amplifier 220.

Memory cell 202 is a DRAM cell including one transistor 212 and a single storage device or cell 214. The transistor 212 of an embodiment is an n-channel or NMOS transistor, but alternative embodiments can use various other types of transistors. The storage device 214 of an embodiment is a capacitor coupled among the drain (source) of transistor 212 and the gates of NMOS transistor 112 and PMOS transistor 116 of the compare circuit 104. The source (drain) of transistor 212 is coupled to the bit line while the gate of transistor 212 is coupled to the word line. The writing of data to and the reading of data from the capacitor 214 is performed by charge transfer through the bit line and transistor 212 in response to the logical state of the word line.

Masking cell 208 is a DRAM cell including one transistor 222 and a single storage device or cell 224. The transistor 222 of an embodiment is an n-channel or NMOS transistor, but alternative embodiments can use various other types of transistors. The storage device 224 of an embodiment is a capacitor coupled among the drain (source) of transistor 222 and the masking circuit 206. The source (drain) of transistor 222 is coupled to the mask bit line while the gate of transistor 222 is coupled to the word line. The writing of data to and the reading of data from the capacitor 224 is performed by charge transfer through the mask bit line and transistor 222 in response to the logical state of the word line.

Masking circuit 206 includes a mask control transistor 226. The source (drain) of mask control transistor 226 is coupled to the drains (sources) of NMOS transistor 112 and PMOS transistor 116 of compare circuit 104. The drain (source) of mask control transistor 226 is coupled to ground. Local mask data of the storage device 224 controls the gate, and thus the conducting state, of mask control transistor 226. When the local mask data is a logic one indicating a non-mask condition, mask control transistor 226 is conducting or "on" such that the compare results generated by compare circuit 104 control the logical state of the match line via the coupled path to ground potential. When, however, the local mask data is a logic zero indicating a mask condition, mask control transistor 206 is non-conducting or "off" such that the compare results generated by compare circuit 104 do not affect the logical state of the match line because of the absence of a discharge path to ground potential.

The truth table for the operation of ternary DRAM CAM cell 200 is shown in Table 1

TABLE 1

| C | CB | Cell 202 | MASK | Match Line |
|---|----|----------|------|------------|
| 0 | 1  | 0        | 1    | 1          |
| 0 | 1  | 1        | 1    | 0          |
| 1 | 0  | 0        | 1    | 0          |
| 1 | 0  | 1        | 1    | 1          |
| 0 | 1  | 0        | 0    | 1          |
| 0 | 1  | 1        | 0    | 1          |
| 1 | 0  | 0        | 0    | 1          |
| 1 | 0  | 1        | 0    | 1          |

Referring to the first row of the truth table of Table 1, along with FIG. 2, the operation of ternary DRAM CAM cell 200 is described. When the local mask data is a logic one, the match control transistor 226 is in a conducting state; consequently, the result of the compare operation is not masked. The logic one of the CB signal line causes transistor 110 to be in a conducting state while the logic zero of the memory cell 202 causes transistor 112 to be in a non-conducting state, resulting in the absence of a conducting path through the left path of the compare circuit 104. Turning to the right path of the compare circuit 104, the logic zero of the C signal line causes transistor 114 to be in a non-conducting state while the logic zero of the memory cell 202 causes PMOS transistor 116 to be in a conducting state; the result is the absence of a conducting path through the right path of the compare circuit 104.

As no conducting path exists between the match line and ground potential through the compare circuit 104, the state of the match line remains in the pre-charged state as determined by the pre-charge circuit 218. The pre-charge state in this example is $V_{DD}$ or logic one, but alternative embodiments can use any number of logic states for the match line prior to compare operations. Thus, the logic one state of the match line following the comparison indicates a match between the logic zero stored in the memory cell 202 and the logic zero of the comparand data on signal line C.

With reference to the second row of the truth table of Table 1, the memory cell 202 stores a logic one. Also, the local mask data is a logic one so the result of the compare operation is not masked. The logic one of the CB signal line causes transistor 110 to be in a conducting state while the logic one of the memory cell 202 causes transistor 112 to also be in a conducting state, resulting in a conducting path between the match line and ground potential through the left path of the compare circuit 104. The conducting path to ground allows the match line to discharge to a logic zero level from the pre-charged level. Thus, the logic zero state of the match line following the comparison indicates the absence of a match between the logic one stored in the memory cell 202 and the logic zero of the comparand data on signal line C.

Referring to the third row of the truth table of Table 1, the memory cell 202 again stores a logic zero. The logic zero of the CB signal line causes transistor 110 to be in a non-conducting state while the logic zero of the memory cell 202 causes transistor 112 to be in a non-conducting state, resulting in the absence of a conducting path through the left path of the compare circuit 104. Turning to the right path of the compare circuit 104, the logic one of the C signal line causes transistor 114 to be in a conducting state while the logic zero of the memory cell 202 causes PMOS transistor 116 to be in a conducting state, the result is a conducting path through the right path of the compare circuit 104. The conducting path to ground allows the match line to discharge to a logic zero level from the pre-charged level, the logic zero state of the match line indicating the absence of a match between the logic zero stored in the memory cell 202 and the logic one of the comparand data on signal line C.

As for the fourth row of the truth table of Table 1, the memory cell 202 stores a logic one. The logic zero of the CB signal line causes transistor 110 to be in a non-conducting state while the logic one of the memory cell 202 causes transistor 112 to be in a conducting state, resulting in the absence of a conducting path between the match line and ground potential through the left path of the compare circuit 104. For the right path of the compare circuit 104, the logic one of the C signal line causes transistor 114 to be in a conducting state while the logic one of the memory cell 202 causes PMOS transistor 116 to also be in a non-conducting state; the result is no conducting path through the right path of the compare circuit 104. As no conducting path exists between the match line and ground potential through the compare circuit 104, the state of the match line remains in the pre-charged state as determined by the pre-charge circuit 218. Thus, the logic one state of the match line following the comparison indicates a match between the logic one stored in the memory cell 202 and the logic one of the comparand data on signal line C.

The fifth through eighth rows of the truth table of Table 1 show operation of the ternary DRAM CAM cell 200 when the compare results are masked. When the local mask data is a logic zero, the match control transistor 226 is in a non-conducting state, thereby preventing the establishment of any conducting path between the match line and ground potential regardless of the results of the compare operation. As such, the result of the compare operation is masked so that the match line remains at the pre-charged state and indicates a match regardless of the results of the compare operation.

Figure 3:
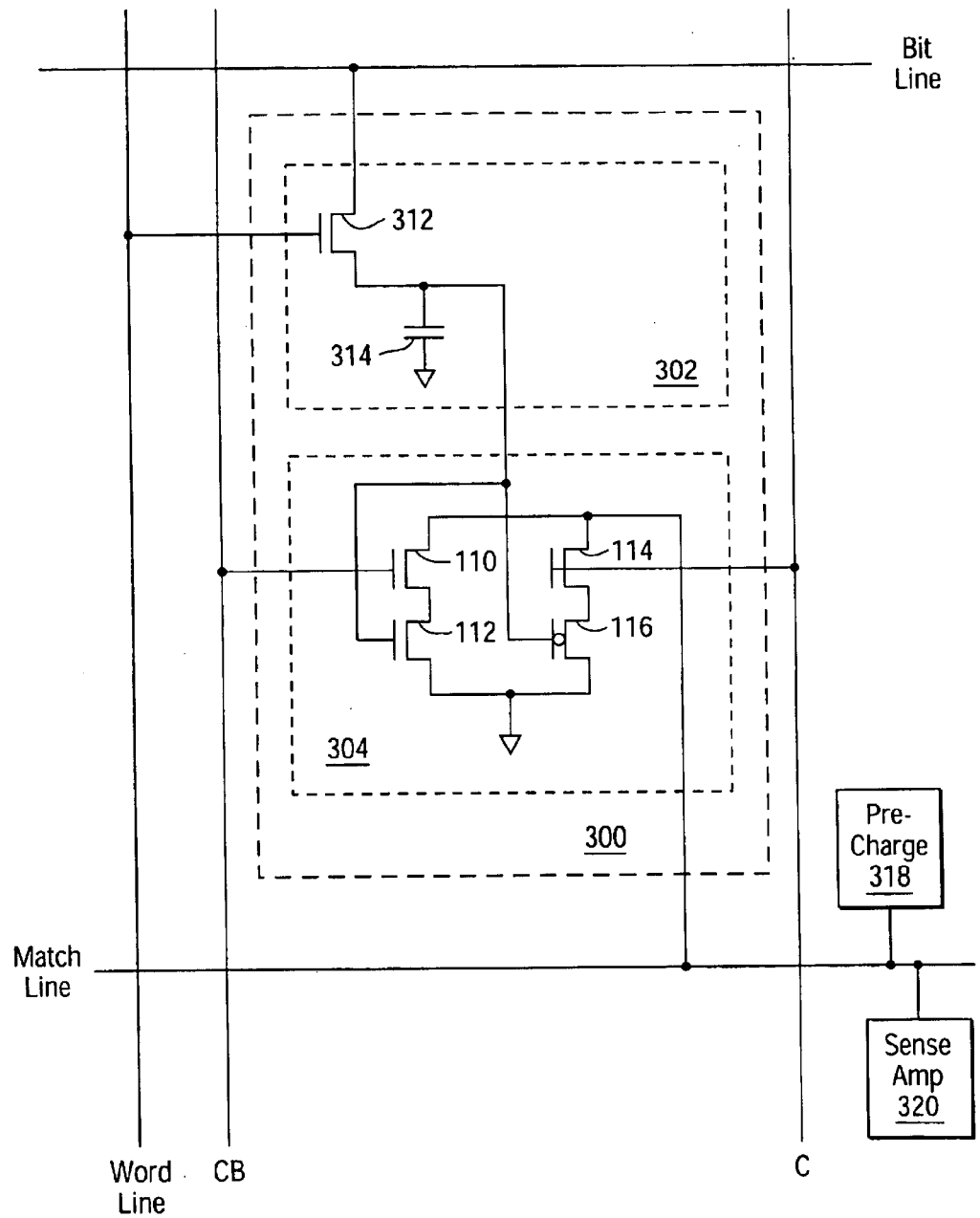
FIG. 3 is a block diagram of a binary DRAM CAM cell that includes a compare circuit having a combination of n-channel and p-channel transistors, under an alternative embodiment.

An alternative to the ternary DRAM CAM cells 100 and 200 described above includes a binary DRAM CAM cell. FIG. 3 is a block diagram of a binary DRAM CAM cell 300 that includes a compare circuit 304 having a combination of n-channel and p-channel transistors, under an alternative embodiment. Binary DRAM CAM cell 300 also includes memory cell 302; the memory cell 302 is an exemplary embodiment of a memory cell, but is not so limited as many alternative embodiments exist for this circuit A match line couples the ternary DRAM CAM cell 300 of an embodiment to a number of other DRAM CAM cells (not shown) to form a row of a CAM device. Furthermore, the match line couples the DRAM CAM cells of the row to a pre-charge circuit 318 and a sense amplifier 320.

Memory cell 302 is a DRAM cell including one transistor 312 and a single storage device or cell 314. The transistor 312 of an embodiment is an n-channel or NMOS transistor, but alternative embodiments can use various other types of transistors. The storage device 314 of an embodiment is a capacitor coupled among the drain (source) of transistor 312 and the gates of NMOS transistor 112 and PMOS transistor 116 of the compare circuit 304. The source (drain) of transistor 312 is coupled to the bit line while the gate of transistor 312 is coupled to the word line. The writing of data to and the reading of data from the capacitor 314 is performed by charge transfer through the bit line and transistor 312 in response to the logical state of the word line.

The truth table for the operation of binary DRAM CAM cell 300 is shown in Table 2.

TABLE 2

| C | CB | Cell 302 | Match Line |
|---|----|----------|------------|
| 0 | 1  | 0        | 1          |
| 0 | 1  | 1        | 0          |
| 1 | 0  | 0        | 0          |
| 1 | 0  | 1        | 1          |

With reference to the first row of the truth table of Table 2 and FIG. 3, the operation of binary DRAM CAM cell 300 is described. Memory cell 302 stores a logic zero. The logic one of the CB signal line causes transistor 110 to be in a conducting state while the logic zero of the memory cell 302 causes transistor 112 to be in a non-conducting state, resulting in the absence of a conducting path between the match line and ground potential through the left path of the compare circuit 304. The logic zero of the C signal line causes transistor 114 to be in a non-conducting state while the logic zero of the memory cell 302 causes PMOS transistor 116 to be in a conducting state, resulting in the absence of a conducting path between the match line and ground through the right path of the compare circuit 304. The absence of a conducting path through the compare circuit 304 causes the state of the match line to remain at the pre-charged level, logic one. The logic one state of the match line following the comparison indicates a match between the logic zero stored in the memory cell 302 and the logic zero of the comparand data on signal line C.

Continuing the example with reference to the second row of the truth table of Table 2, memory cell 302 stores a logic one. The logic one of the CB signal line causes transistor 110 to be in a conducting state while the logic one of the memory cell 202 causes transistor 112 to be in a conducting state. The result is a conducting path between the match line and ground potential through the left path of the compare circuit 304. The conducting path to ground allows the match line to discharge to a logic zero level from the pre-charged level, thereby indicating the absence of a match between the logic one stored in the memory cell 302 and the logic zero of the comparand data on signal line C.

Referring to the third row of the truth table of Table 2, memory cell 302 stores a logic zero. The logic zero of the CB signal line causes transistor 110 to be in a non-conducting state while the logic zero of the memory cell 302 causes transistor 112 to also be in a non-conducting state, resulting in the absence of a conducting path between the match line and ground potential through the left path of the compare circuit 304. The logic one of the C signal line causes transistor 114 to be in a conducting state while the logic zero of the memory cell 302 causes PMOS transistor 116 to also be in a conducting state, resulting in a conducting path between the match line and ground through the right path of the compare circuit 304. The conducting path to ground allows the match line to discharge to a logic zero level from the pre-charged level. Thus, the logic zero state of the match line following the comparison indicates the absence of a match between the logic zero stored in the memory cell 302 and the logic one of the comparand data on signal line C.

Data of the fourth row of the truth table of Table 2 shows memory cell 302 storing a logic one. The logic zero of the CB signal line causes transistor 110 to be in a non-conducting state while the logic one of the memory cell 202 causes transistor 112 to be in a conducting state. The result is a non-conducting path between the match line and ground potential through the left path of the compare circuit 304. The logic one of the C signal line causes transistor 114 to be in a conducting state while the logic one of the memory cell 302 causes PMOS transistor 116 to be in a non-conducting state; the result is the absence of a conducting path between the match line and ground potential through the right path of the compare circuit 304. The absence of a conducting path through the compare circuit 304 causes the state of the match line to remain at the pre-charged level, logic one, indicating a match between the logic one stored in the memory cell 302 and the logic one of the comparand data on signal line C.

As described above, the parallel transistor stacks used in the compare circuit of the DRAM CAM cell form discharge paths or discharge circuits. The discharge paths operate such that a pre-charged logic one or logic high match line will remain at the logic one state in the case of a match between the data stored in the memory cell and the corresponding compare data. However, the match line is discharged to a logic zero state (ground potential) via a discharge path through the compare circuit in the absence of a match between the data stored in the memory cell and the corresponding compare data.

Alternatively, the discharge paths of the compare circuit support a pre-charged logic zero match line that remains in the logic zero state in the case of a match between the data stored in the memory cell and the corresponding compare data. In this case, the match line is charged to a logic one state ($V_{DD}$ potential) via a path through the compare circuit in the absence of a match between the data stored in the memory cell and the corresponding compare data.

In the compare circuit architecture of an embodiment, for example FIG. 1, NMOS transistors 110 and 112 are coupled in series to form a first or left path through the compare circuit 104 between the match line and ground potential (assuming a non-mask condition). Similarly, NMOS transistor 114 and PMOS transistor 116 are coupled in series to form a second or right path through the compare circuit 104 between the match line and ground potential.

The physical electronic differences between n-type and p-type semiconductor devices, however, result in different discharge characteristics through the left (NMOS/NMOS) and right (NMOS/PMOS) paths of compare circuit 104. In particular, the match line discharges to approximately $V_{SS}$ (ground) potential when discharging through the NMOS/NMOS combination of the left path and, because of the different threshold voltage associated with the p-channel device, discharges to a higher potential (e.g., approximately 0.9 volts) when discharging through the NMOS/PMOS combination of the right path. An example follows to illustrate the discharge characteristics of the different paths of the compare circuit.

Figure 4:
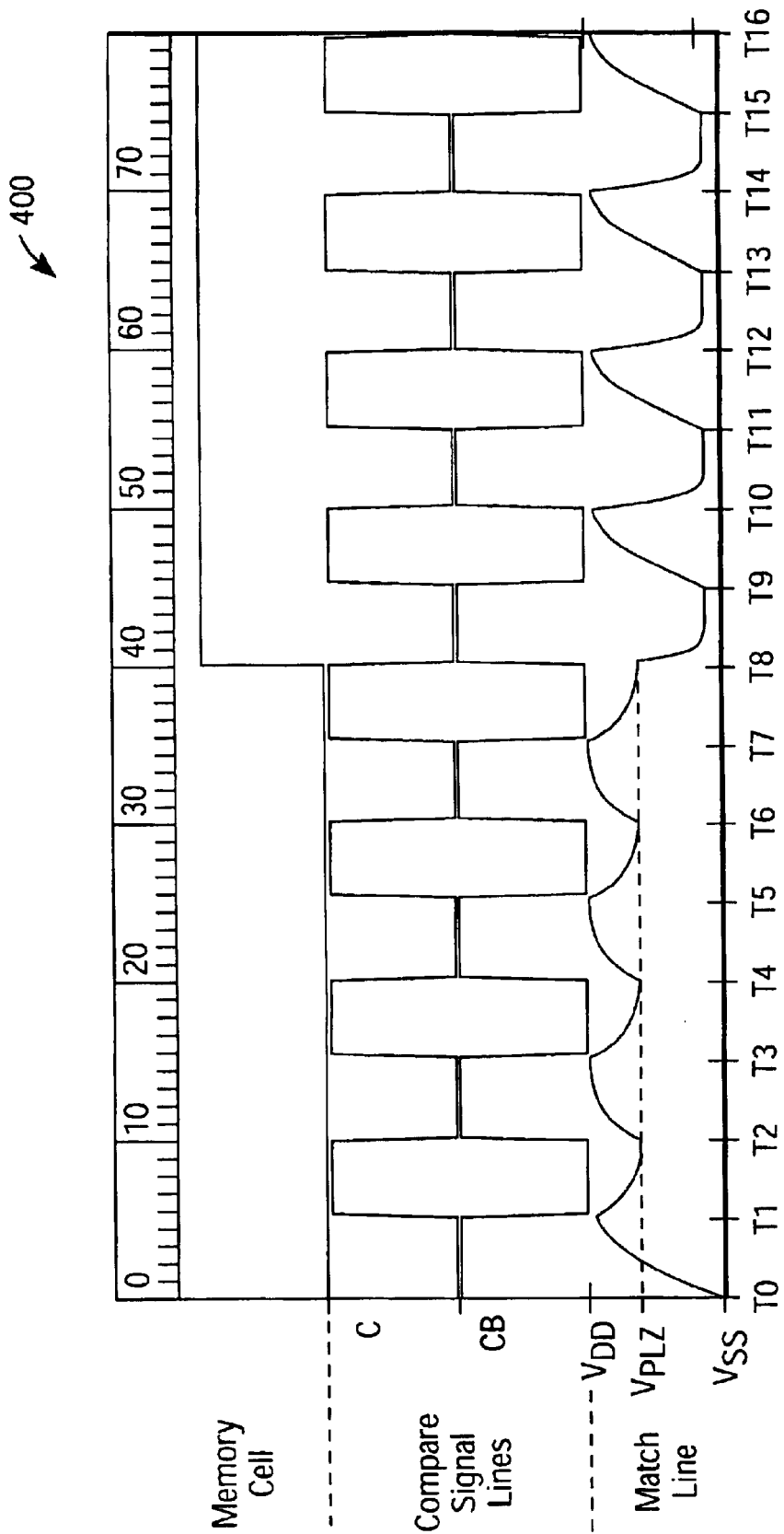
FIG. 4 is a plot of voltage versus time for the match line, compare signal lines, and memory cell content of the DRAM CAM cell of an embodiment.

FIG. 4 is a plot 400 of voltage versus time for the match line, compare signal lines, and memory cell of the DRAM CAM cell having a compare circuit including a combination of n-channel and p-channel transistors, under an embodiment. With additional reference to FIG. 1 along with the truth table of Table 1, and assuming a non-mask condition (MASK is logic one), the conditions at time T0 coincide with the first row of the truth table (comparand signal of signal line C is logic zero, memory cell 102 stores a logic zero). The match between the data of the memory cell 102 and the comparand data results in a match line signal of logic one (e.g., $V_{DD}$).

At time T1 the comparand signal of signal line C changes to a logic one, and these conditions correspond to the third row of the truth table (comparand signal of signal line C is logic one, memory cell 102 stores a logic zero). The absence of a match between the data of the memory cell and the comparand data results in discharge of the match line through the right path of the compare circuit 104 (NMOS transistor 114 and PMOS transistor 116) from $V_{DD}$ to a potential that corresponds to a logic zero. As the match line is eventually discharged through the NMOS/PMOS transistor combination of an embodiment from a logic one (for example, $V_{DD}$ of approximately 1.5 volts) to a potential of $V_{PLZ}$ volts, the match line potential corresponding to a logic zero is greater than $V_{PLZ}$.

In contrast, the conditions at time T9 coincide with the fourth row of the truth table (comparand signal of signal line C is logic one, memory cell 102 stores a logic one). The match between the data of the memory cell and the comparand data results in a match line signal of logic one (e.g., $V_{DD}$). At time T10 the compare signal C changes to a logic zero, and these conditions correspond to the second row of the truth table (comparand signal of signal line C is logic zero, memory cell 102 stores a logic one). The absence of a match between the data of the memory cell and the compare signal results in discharge of the match line to a logic zero state through the left path of the compare circuit 104 (NMOS transistors 110 and 112). As shown, the match line is discharged through the NMOS/NMOS transistor combination to a potential of approximately $V_{SS}$ or ground.

The DRAM CAM cell of various embodiments disclosed herein includes a sense amp, also referred to as a reference sense amplifier or match detect circuit, to accurately detect and/or latch the logical state of the match line regardless of the match line potential levels. As such, the sense amp provides signals appropriate to the trip level of any logic circuits to which the match line couples. Referring to FIGS. 1, 2, and 3, for example, the DRAM CAM cells 100, 200, 300 include a sense amp 120, 220, 320 coupled to the match line, but are not so limited.

The sense amp receives match line signals along with a reference voltage from a voltage source. The reference voltage is a fixed voltage relative to the match line signal. In an embodiment, the match line signal is coupled to a first input of the sense amp while the fixed reference voltage is coupled to a second input of the sense amp, but the embodiment is not so limited.

The sense amp differentially compares the match line signal voltage with the reference voltage. In response to this comparison, the sense amp provides an output signal having one of two logic states. The first logic state represents a condition in which the voltage of the match line signal is greater than the reference voltage. The second logic state represents a condition in which the voltage of the match line signal is less than the reference voltage. Consequently, the sense amp supports accurate high-speed sensing of the match line state and, thus, the results of the compare circuit compare operations using a single-ended comparison of the match line voltage against a fixed reference voltage.

In this manner, the sense amp of the embodiments described herein supports detecting and/or latching of compare operation results prior to a full swing of the voltage on the match line. As such, the sense amp rapidly detects the logic state of the match line even before the match line potential drops fully from a pre-charged potential (e.g., $V_{DD}$) to the lowest potentials for the corresponding discharge path through the compare circuit, for example.

The sense amp of an embodiment couples to or includes a fixed reference voltage appropriate to the components of the compare circuit and corresponding potential levels of the match line. For example, a fixed reference voltage approximately in the range of 1.2 to 1.3 volts provides a latch level appropriate to a compare circuit discharging a match line from a $V_{DD}$ of approximately 1.5 volts via a path including one NMOS and one PMOS transistor coupled in series, but is not so limited. The reference voltage of this embodiment is determined by taking the difference between the average logic high potential of the match line and the average logic low potential of the match line following discharge through the NMOS/PMOS transistor combination (e.g., $V_{PLZ}$ equal to approximately 0.9 volts), but may be determined using various other method known to one skilled in the art.

The ternary DRAM CAM cells disclosed above use masking that, when enabled, masks the results of the compare operation. However, other types of masking are available for use in CAM cells, including masking of the comparand data and masking of the data of the memory cell. As with the DRAM CAM cells disclosed above, the DRAM-based CAM cells that mask the comparand data and the data of the memory cell also realize reductions in transistor count and provide a proportional decrease in the silicon area occupied by the cell through the use of various combinations of n-channel and p-channel transistors as described below.

Figure 5:
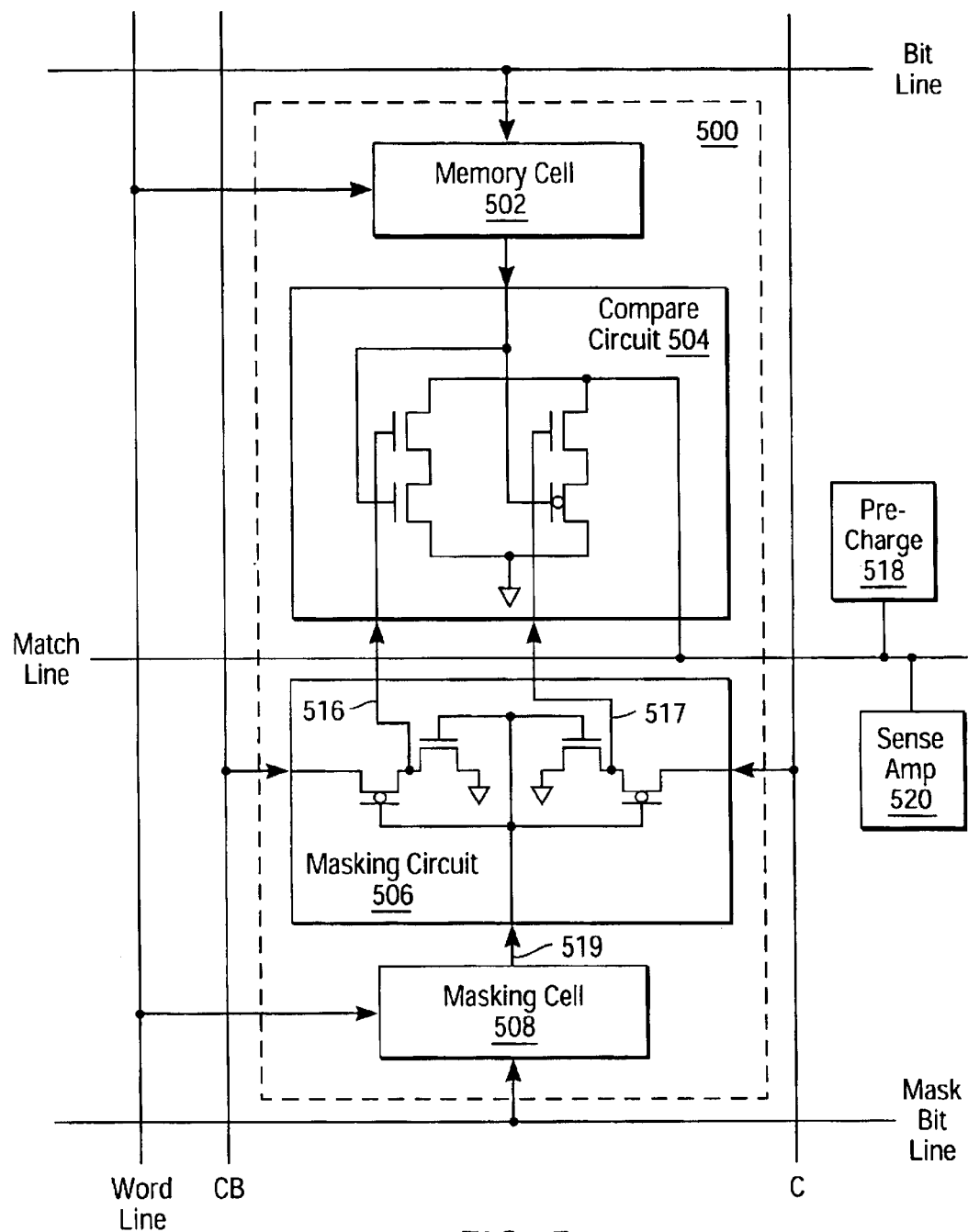
FIG. 5 is a block diagram of a ternary DRAM CAM cell that masks the comparand data, under an alternative embodiment.

FIG. 5 is a block diagram of a ternary DRAM CAM cell 500 that masks the comparand data, under an alternative embodiment. The ternary DRAM CAM cell 500 includes memory cell 502, compare circuit 504, masking circuit 506, and masking cell 508, but is not so limited. A match line couples the ternary DRAM CAM cell 500 of an embodiment to a number of other DRAM CAM cells (not shown) to form a row of a CAM device. Furthermore, the match line couples the DRAM CAM cells of the row to a pre-charge circuit 518 and a sense amplifier 520.

Memory cell 502 stores data to be compared with comparand data provided on compare signal lines C and CB during a compare operation. The memory cell 502 is a DRAM cell, but alternative embodiments can use any volatile or nonvolatile memory cell. When the memory cell 502 is selected by a signal of the word line, data may be read from or written to the memory cell 502 via the bit line.

The compare circuit 504 is coupled to memory cell 502 and compares the data stored in the memory cell 502 with data provided by the masking circuit 506 via lines 516 and 517. The compare circuit 504 controls the logic state of the match line, and the comparison result is determined by evaluating the logic state of the match line.

The masking cell 508 stores local masking data that indicates whether the comparand data provided on compare signal lines C and CB is masked during a comparison operation. Masking cell 508 is a DRAM cell, but various alternative embodiments may use any volatile or nonvolatile memory cell. When the masking cell 508 is selected by the word line, masking data may be read from or written to the masking cell 508 via the mask bit line. The masking circuit 506 receives the masking data from the masking cell 508 over line 519 and, in response thereto, provides either comparand data of compare signal lines C and CB or masked data to compare circuit 504 via lines 516 and 517. Thus, in response to the masking data stored in the masking cell 508, masking circuit 506 either provides the comparand data or masked comparand data to the compare circuit 504.

For example, when the masking data stored in masking cell 508 indicates that the data in memory cell 502 should be masked from a comparison with the comparand data, masking circuit 508 provides masked comparand data to compare circuit. 504 such that compare circuit 504 controls the match line to always provide a match indication regardless of whether the data stored in memory cell 502 actually matches the comparand data. The masked comparand data provided on lines 516 and 517 may be any predetermined data. When the masking data stored in the masking cell 508 indicates that the data stored in memory cell 502 should not be masked from a comparison with the comparand data, the masking circuit 506 provides the comparand data to compare circuit 504 to compare with the data stored in memory cell 502.

Figure 6:
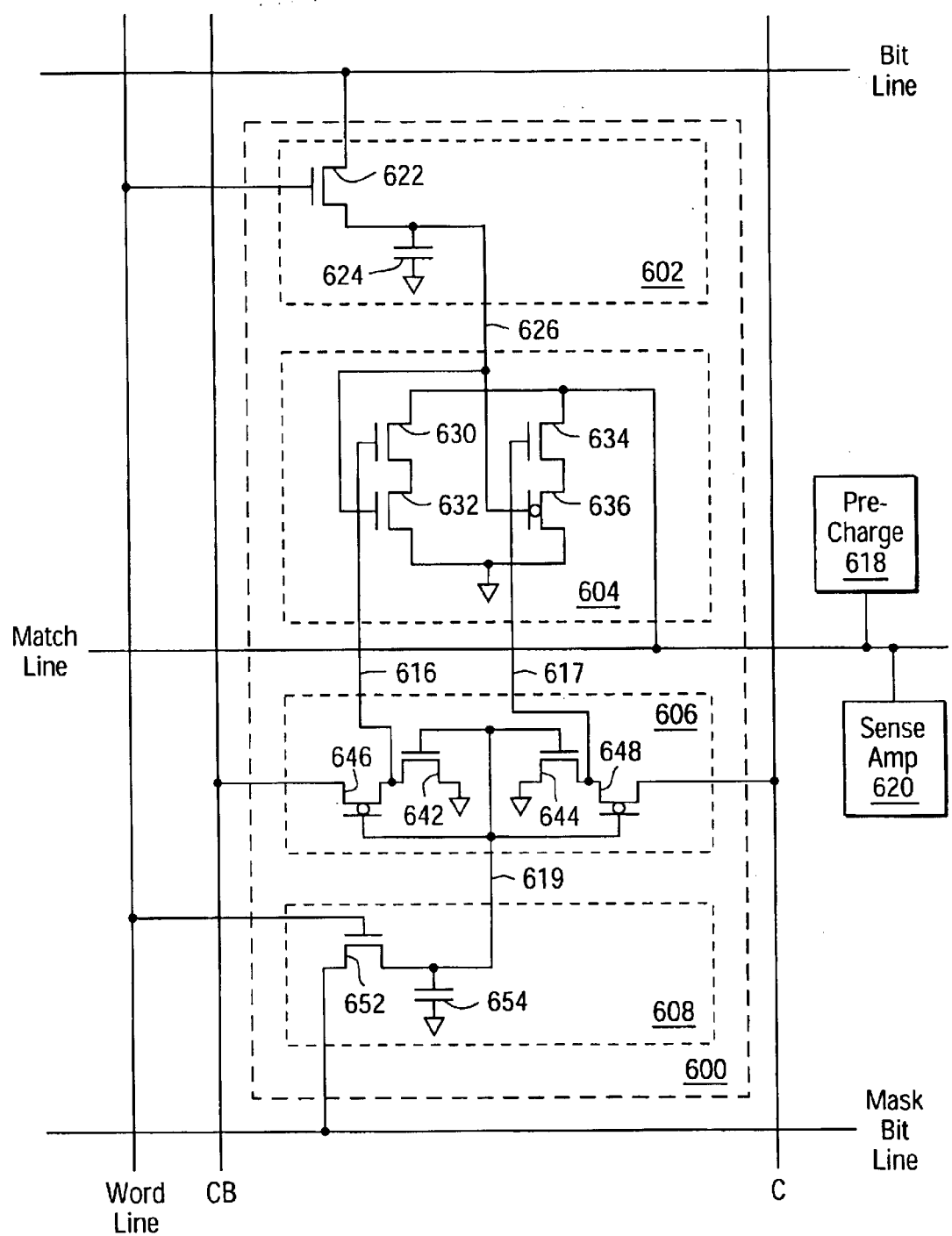
FIG. 6 is a block diagram of a ternary DRAM CAM cell that masks comparand data, under the embodiment of FIG. 5.

FIG. 6 is a block diagram of a ternary DRAM CAM cell 600 that masks comparand data, under the embodiment of FIG. 5. The DRAM CAM cell 600 includes memory cell 602, compare circuit 604, masking circuit 606, and masking cell 608, of which memory cell 602 and masking cell 608 are exemplary embodiments of memory cell 502 and masking cell 508.

Memory cell 602 is a DRAM cell including one transistor 622 and a single storage device or cell 624. The transistor 622 of an embodiment is an n-channel or NMOS transistor, but alternative embodiments can use various other types of transistors or combinations of circuit elements. The storage device 624 of an embodiment is a capacitor coupled among the drain (source) of transistor 622 and the gates of NMOS transistor 632 and p-channel or PMOS transistor 636 of the compare circuit 608. The source (drain) of transistor 622 is coupled to the bit line while the gate of transistor 622 is coupled to the word line. The writing of data to and the reading of data from the capacitor 624 is performed by charge transfer through the bit line and transistor 622 in response to the logical state of the word line. The data stored by memory cell 602 is passed on line 626 to compare circuit 604 for comparison with the data output by masking circuit 606.

Masking cell 608 is a DRAM cell including one transistor 652 and a single storage device or cell 654. The transistor 652 of an embodiment is an n-channel or NMOS transistor, but alternative embodiments can use various other types of transistors or combinations of circuit elements. The storage device 654 of an embodiment is a capacitor coupled among the drain (source) of transistor 652 and the gates of NMOS transistors 642 and 644 of the masking circuit 606. The source (drain) of transistor 652 is coupled to the mask bit line while the gate of transistor 652 is coupled to the word line. The writing of data to and the reading of data from the capacitor 654 is performed by charge transfer through the mask bit line and transistor 652 in response to the logical state of the word line.

The masking data of the masking cell 608 controls the masking circuit 606 via line 619. Masking circuit 606 includes transistors 642 and 646 that determine whether comparand data or masked data is provided to the compare circuit 604 via line 616 in response to the masking data on line 619. Transistor 646 is a p-channel or PMOS transistor having the source (drain) coupled to comparand signal line CB, the drain (source) coupled to line 616, and the gate coupled to line 619. Transistor 642 is an NMOS transistor having the drain (source) coupled to line 616, the source (drain) coupled to ground, and the gate coupled to line 619.

Masking circuit 606 further includes transistors 648 and 644 that determine whether masked data or comparand data is provided to the compare circuit 604 via line 617 in response to the masking data on line 619. Transistor 648 is a PMOS transistor having the source (drain) coupled to comparand signal line C, the drain (source) coupled to line 617, and the gate coupled to line 619. Transistor 642 is an NMOS transistor having the drain (source) coupled to line 617, the source (drain) coupled to ground, and the gate coupled to line 619.

Compare circuit 604 includes two sets of transistors that function to compare the data output by memory cell 602 with the data output by masking circuit 606 on lines 616 and 617. A first set of transistors includes NMOS transistors 630 and 632 coupled in series to form a first discharge path, where the drain (source) of transistor 630 is coupled to the source (drain) of transistor 632. The source (drain) of transistor 630 is coupled to the match line. The gate of transistor 630 is coupled to receive data from the masking circuit 606 via line 616. The gate of transistor 632 receives data from the memory cell 602. The drain (source) of transistor 632 is coupled to ground.

A second set of transistors includes NMOS transistor 634 and PMOS transistor 36 coupled in series to form a second discharge path, where the drain (source) of NMOS transistor 634 is coupled to the source (drain) of PMOS transistor 636. The source drain) of transistor 634 is coupled to the match line, and the gate of transistor 634 is coupled to receive data from the masking circuit 606 via line 617. The gate of transistor 636 receives data from the memory cell 602. The drain (source) of transistor 636 is coupled to ground.

The match line of an embodiment couples the ternary DRAM CAM cell 600 to other CAM cells (not shown) to form a row of a CAM device. The match line is pre-charged to a voltage approximately equal to a power supply voltage $V_{DD}$ by pre-charge circuit 618. The match line of alternative embodiments may be pre-charged to various logic levels. The match line is also coupled to a sense amplifier 620.

An operational example of the ternary DRAM CAM cell 600 using comparand data masking follows, but the embodiment and alternative embodiments are not so limited in operation. When masking is disabled, masking cell 608 stores and subsequently provides a logic zero to masking circuit 606 via line 619; the logic zero mask value places transistors 642 and 644 in a non-conducting state and places transistors 646 and 648 in a conducting state. This transistor configuration causes data from the comparand signal lines C and CB to be provided to the gates of transistors 634 and 630, respectively. Thus, when masking is disabled, compare circuit 604 may compare the data of the memory cell 602 with the comparand data from compare signal lines C and CB, respectively. In the case where a match occurs between the data of the memory cell 602 and the comparand data, neither the first nor the second discharge paths of compare circuit 604 provide a path to ground and the state of the match line remains in the pre-charged state, logic one. In the absence of a match between the data of the memory cell 602 and the comparand data, the match line discharges towards ground through one of the discharge paths of the compare circuit 604.

When masking is enabled, masking cell 608 stores and provides a logic one signal on line 619 that places transistors 642 and 644 in a conducting state and places transistors 646 and 648 in a non-conducting state. This transistor configuration prevents data from the comparand signal lines C and CB from being provided to the gates of transistors 634 and 630, respectively, while placing transistors 630 and 634 in a non-conducting state by coupling the gates of transistors 630 and 634 to a masked signal having ground potential. Therefore, no path to ground is available for the match line via the compare circuit 604, regardless of whether the comparand data on compare signal lines C and CB matches the data stored by memory cell 602. Thus, DRAM CAM cell 600 effectively stores a don't care state for the compare operation.

Figure 7:
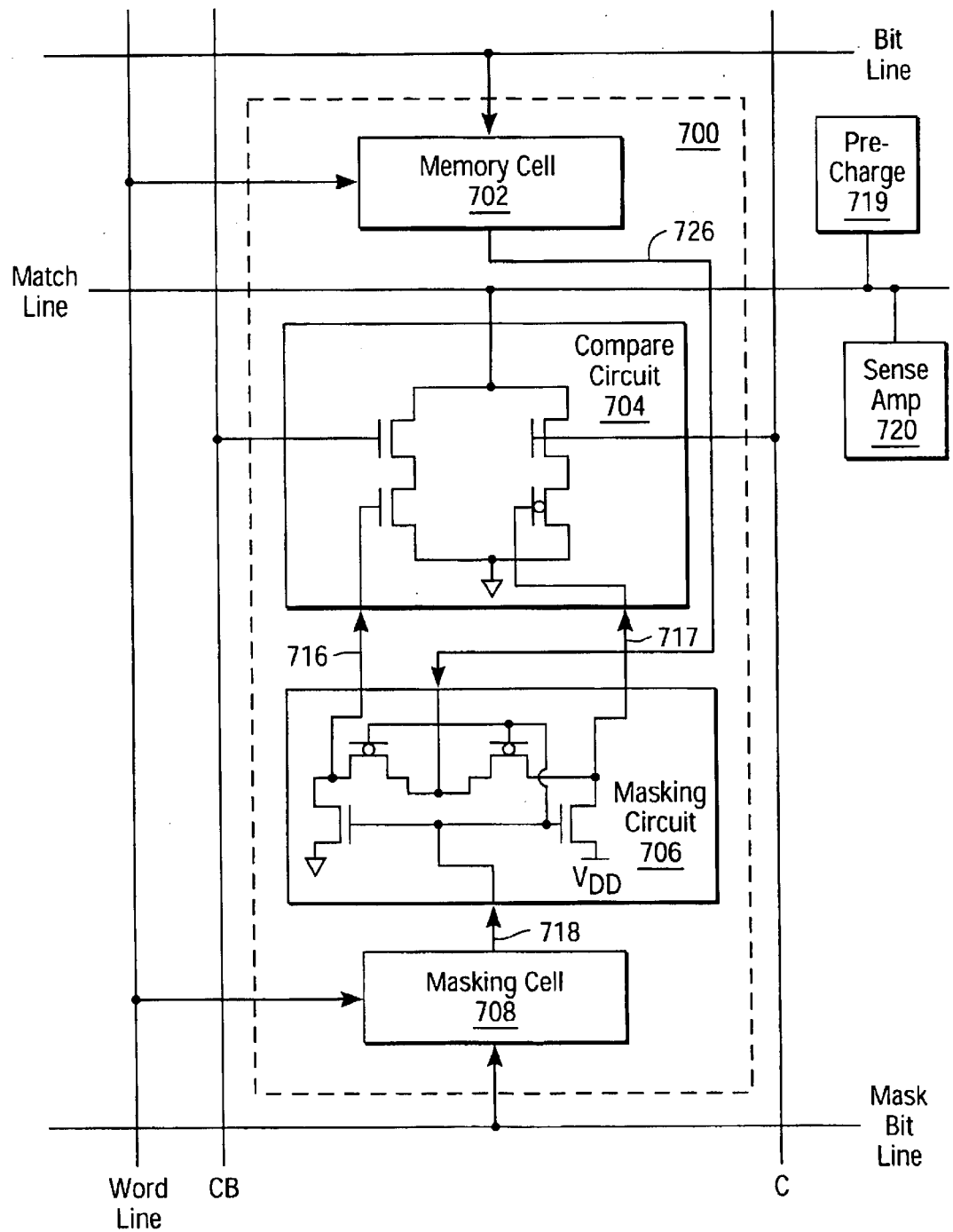
FIG. 7 is a block diagram of a ternary DRAM CAM cell that masks input data, under another alternative embodiment.

Similar to the ternary DRAM CAM cell described above that masks comparand data, ternary DRAM CAM cells that mask input data also make use of the DRAM CAM cell architecture described herein. FIG. 7 is a block diagram of a ternary DRAM CAM cell 700 that masks input data, under another alternative embodiment. The ternary DRAM CAM cell 700 includes memory cell 702, compare circuit 704, masking circuit 706, and masking cell 708, but is not so limited.

Memory cell 702 stores data to be compared with comparand data provided on compare signal lines C and CB during a compare operation. The memory cell 702 is a DRAM cell, but may be any volatile or nonvolatile memory cell. When the memory cell 702 is selected by a signal of the word line, data may be read from or written to the memory cell 702 via the bit line. The memory cell 702 couples to provide data stored in the memory cell 702 to the masking circuit 706 via line 726.

The compare circuit 704 couples to control the logic state of the match line in response to data received from the masking circuit 706 via lines 716 and 717. The compare circuit 704 compares the data received from the masking circuit 706 with comparand data received via the compare signal lines C and CB. The compare circuit 704 controls the logic state of the match line, and the comparison result is determined by evaluating the logic state of the match line.

The masking cell 708 stores local masking data that indicates whether the data stored in memory cell 702 is masked during a comparison operation. The masking cell 708 of an embodiment is a DRAM cell, but alternative embodiments can use any volatile or nonvolatile memory cell. When the masking cell 708 is selected by the word line, masking data is read from or written to the masking cell 708 via the mask bit line. The masking circuit 706 receives the masking data from the masking cell 708 via line 718 and, in response thereto, provides either data from the memory cell 702 or masked data to compare circuit 704 via lines 716 and 717.

For example, when the masking data stored in masking cell 708 indicates that the data in memory cell 702 should be masked from a comparison with the comparand data, masking circuit 706 provides masked data via lines 716 and 717 to compare circuit 704 instead of the data of the memory cell 702. In response, compare circuit 704 controls the match line logic state so as to always provide a match indication regardless of whether the data stored in memory cell 702 actually matches the comparand data. The masked data provided on line 716 is a logic zero and on line 717 is a logic one, but may be any predetermined data. When the masking data stored in the masking cell 708 indicates that the data stored in memory cell 702 should not be masked from a comparison with the comparand data, the masking circuit 706 provides the data stored in memory cell 702 to compare circuit 704 for comparison with the comparand data.

The match line couples the ternary DRAM CAM cell 700 of an embodiment to a number of other DRAM CAM cells (not shown) to form a row of a CAM device. The match line also couples the DRAM CAM cells of the row to a precharge circuit 719 and a sense amplifier 720 of the associated CAM device.

Figure 8:
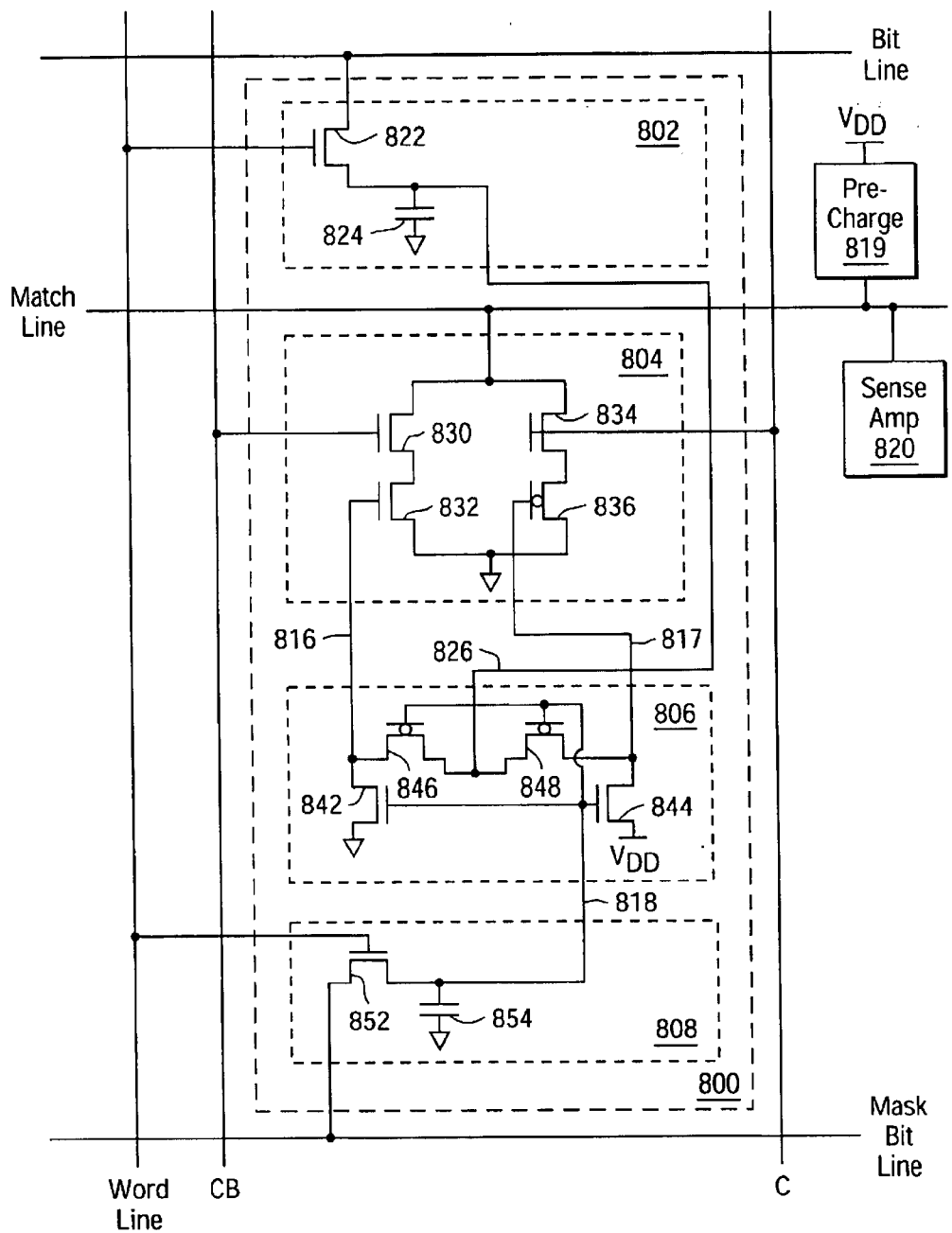
FIG. 8 is a block diagram of a ternary DRAM CAM cell that masks input data, under the embodiment of FIG. 7.

FIG. 8 is a block diagram of a ternary DRAM CAM cell 800 that masks input data, under the embodiment of FIG. 7. The DRAM CAM cell 800 includes memory cell 802, compare circuit 804, masking circuit 806, and masking cell 808 which are exemplary embodiments.

Memory cell 802 is a DRAM cell including one transistor 822 and a single storage device or cell 824. The transistor 822 of an embodiment is an n-channel or NMOS transistor, but alternative embodiments can use various other types of transistors or combinations of circuit elements. The storage device 824 of an embodiment is a capacitor coupled among the drain (source) of transistor 822 and the sources (drains) of NMOS transistors 846 and 848 of masking circuit 806. The source (drain) of transistor 822 is coupled to the bit line while the gate of transistor 822 is coupled to the word line. The writing of data to and the reading of data from the capacitor 824 is performed by charge transfer through the bit line and transistor 822 in response to the logical state of the word line. The data stored by memory cell 802 is provided via line 826 to masking circuit 806.

Masking cell 808 is a DRAM cell including one transistor 852 and a single storage device or cell 854. The transistor 852 of an embodiment is an NMOS transistor, but alternative embodiments can use various other types of transistors or combinations of circuit elements. The storage device 854 of an embodiment is a capacitor coupled among the drain (source) of transistor 852, the gates of NMOS transistors 842 and 844, and the gates of PMOS transistors 846 and 848 of the masking circuit 806. The source (drain) of transistor 852 is coupled to the mask bit line while the gate of transistor 852 is coupled to the word line. The writing of data to and the reading of data from the capacitor 854 is performed by charge transfer through the mask bit line and transistor 852 in response to the logical state of the word line.

The masking data of the masking cell 808 controls the masking circuit 806 via line 818. Masking circuit 806 includes two NMOS transistors 842 and 844 and two PMOS transistors 846 and 848 that, in combination, determine whether masked data or data stored in the memory cell 802 is provided to the compare circuit 804 in response to the masking data on line 818.

Transistor 846 is a PMOS transistor having the source (drain) coupled to line 826, the drain (source) coupled to line 816, and the gate coupled to line 818. Transistor 848 is also a PMOS transistor having the source (drain) coupled to line 826, the drain (source) coupled to line 817, and the gate coupled to line 818.

Transistor 842 is an NMOS transistor having the source (drain) coupled to ground potential, the drain (source) coupled to line 816, and the gate coupled to line 818. Transistor 844 is also an NMOS transistor having the source (drain) coupled to a power supply voltage $V_{DD}$, the drain (source) coupled to line 817, and the gate coupled to line 818.

Compare circuit 804 includes two sets of transistors that function to compare the data output by masking circuit 806 on lines 816 and 817 with comparand data provided via the compare signal lines. A first set of transistors includes NMOS transistors 830 and 832 coupled in series to form a first discharge path, where the drain (source) of transistor 830 is coupled to the source (drain) of transistor 832. The source (drain) of transistor 830 is coupled to the match line. The gate of transistor 830 is coupled to receive data from comparand signal line CB. The gate of transistor 832 receives data from the masking circuit 806. The drain (source) of transistor 832 is coupled to ground.

A second set of transistors includes NMOS transistor 834 and PMOS transistor 836 coupled in series to form a second discharge path, where the drain (source) of NMOS transistor 834 is coupled to the source (drain) of PMOS transistor 836. The source (drain) of transistor 834 is coupled to the match line, and the gate of transistor 834 is coupled to receive data from comparand signal line C. The gate of transistor 836 receives data from the masking circuit 806. The drain (source) of transistor 836 is coupled to ground. The match line of an embodiment is pre-charged to a voltage approximately equal to a power supply voltage $V_{DD}$ by pre-charge circuit 819. The match line of alternative embodiments may be pre-charged to various logic levels.

An operational example of the ternary DRAM CAM cell 800 with input data masking follows, but the embodiment and alternative embodiments are not so limited in operation. When masking is disabled, masking cell 808 provides a logic zero on line 818 that places transistors 842 and 844 in a non-conducting state and places transistors 846 and 848 in a conducting state. This transistor configuration causes data stored in the memory cell 802 to be provided to the gates of transistors 832 and 836. Thus, when masking is disabled, compare circuit 804 may compare the data of the memory cell 802 with the comparand data from compare signal lines C and CB. When a match occurs between the data of the memory cell 802 and the comparand data, neither the first nor the second discharge paths of compare circuit 804 provide a path to ground and the state of the match line remains at the pre-charged level, logic one. If there is no match between the data of the memory cell 802 and the comparand data, the match line discharges towards ground through the appropriate one of the discharge paths of the compare circuit 804.

When masking is enabled, masking cell 808 provides a logic one to the masking circuit 806 via line 818. The logic one masking value places transistors 842 and 844 in a conducting state and places transistors 846 and 848 in a non-conducting state. This transistor configuration, while preventing data stored in the memory cell 802 from being provided to the gates of transistors 832 and 836, places transistors 832 and 836 in a non-conducting state by coupling the gates of transistors 832 and 836 to ground potential and to a power supply potential $V_{DD}$, respectively. Therefore, neither the first nor second discharge paths provide a conduction path to ground from the match line, regardless of whether the data stored in memory cell 802 matches the comparand data on compare signal lines C and CB. Thus, DRAM CAM cell 800 effectively stores a don't care state for the compare operation.

The various embodiments of the ternary DRAM CAM cells disclosed above include compare circuits having two discharge paths, where one discharge path includes a series combination of n-channel transistors and the other discharge path includes a series combination of an n-channel and a p-channel transistor. Alternative embodiments of the compare circuit also include combinations of n-channel and p-channel transistors, with various transistor combinations and discharge path configurations possible.

Figure 9:
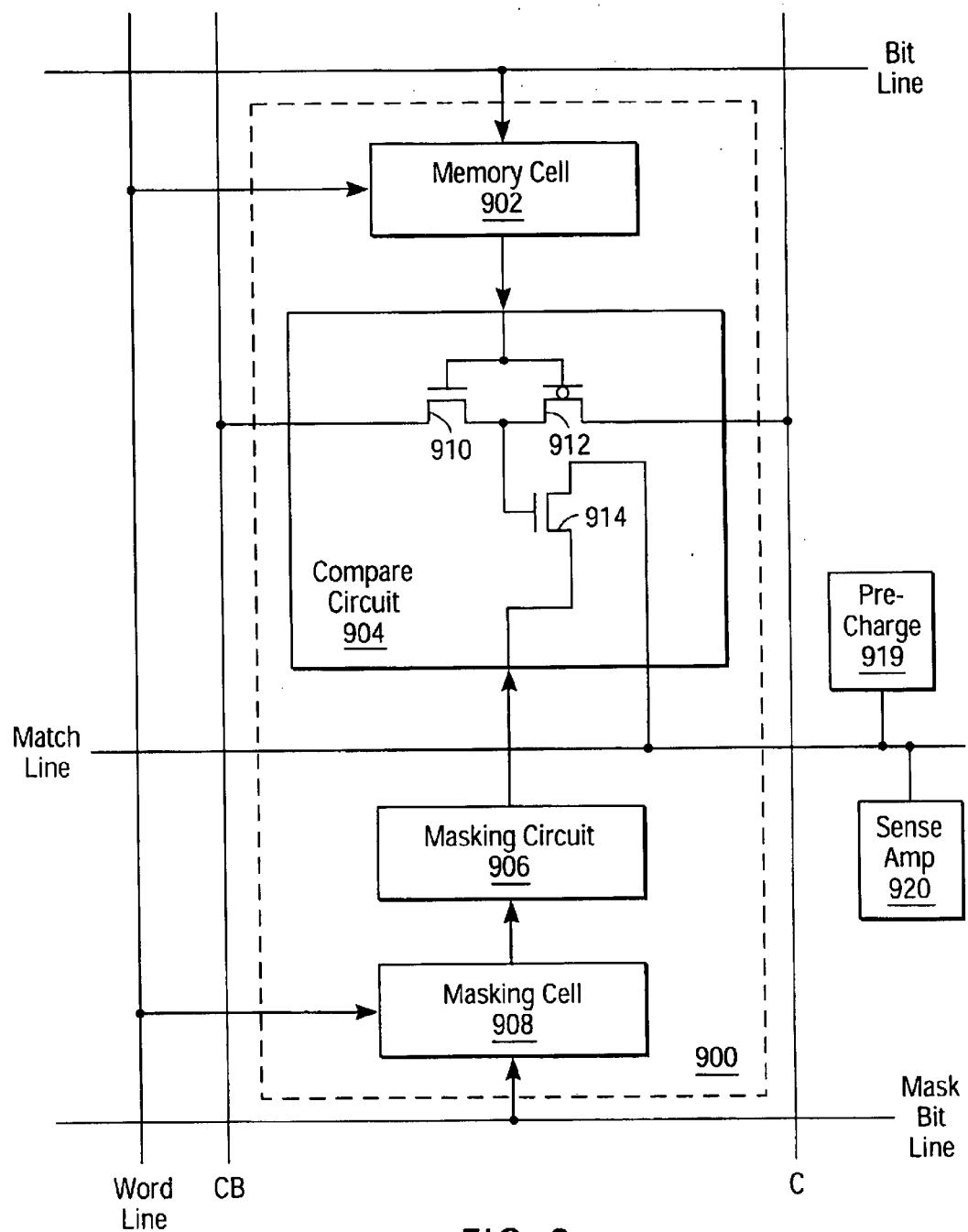
FIG. 9 is a block diagram of a ternary DRAM CAM cell including a compare circuit of an alternative embodiment.

As an example, FIG. 9 is a block diagram of a ternary DRAM CAM cell 900 including a compare circuit of an alternative embodiment. Ternary DRAM CAM cell 900 includes memory cell 902, compare circuit 904, masking circuit 906, and masking cell 908. The memory cell 902 stores data to be compared with comparand data provided on compare signal lines C and CB. The memory cell 902 is a DRAM cell, but may be any type of memory storage element including a volatile or nonvolatile memory storage element. Data is written to and read from the memory cell 902 via the bit line when the word line is asserted to a predetermined logic state. In alternative embodiments, data may be read from or written to the memory cell 902 using any number or combination of bit lines.

Masking cell 908 stores local mask data for the ternary DRAM CAM cell 900.

The masking cell 908 is also a DRAM cell and, like the memory cell 902, can be any type 25 of memory storage element including a volatile or nonvolatile memory storage element. The local mask data is written to or read from the masking cell 908 over a mask bit line when the word line is asserted to a predetermined logic state. In alternative embodiments, separate word lines can couple to each of the memory cell 902 and mask memory cell.

The masking circuit 906 uses the local mask data from the masking cell 908 to control whether the results of the comparison of comparand data with data stored in the memory cell 902 affects the logic state of the match line. When the local mask data indicates that the comparison is to be masked, the masking circuit 906 effectively disables compare circuit 904 such that the comparison results do not affect the match line logic state. When the local mask data indicates that the comparison is not to be masked, mask circuit 906 allows the comparison results generated by compare circuit 904 to control the logic state of the match line (in combination with other CAM cells that may be coupled to the match line).

Compare circuit 904 compares the data stored in the memory cell 902 with comparand data provided on compare signal lines C and CB. Compare circuit 904 includes transistors 910, 912, and 914 that perform the comparison function. Each of transistors 910 and 914 are n-channel or NMOS transistors while transistor 912 is a p-channel or PMOS transistor, but the embodiment is not so limited. The source (drain) of transistor 910 is coupled to compare signal line CB and the drain (source) is coupled to the gate of transistor 914. The source (drain) of transistor 912 is coupled to compare signal line C and the drain (source) is coupled to the gate of transistor 914. The gates of both transistor 910 and 912 are coupled to memory cell 902 to receive data stored therein. Transistor 914 is a match transistor having the source (drain) coupled to the match line and the drain (source) coupled to the masking circuit 906. When the comparand data matches the data stored in the memory cell 902, and the masking circuit 906 does not mask the comparison result, the match line remains at a pre-charged state.

The match line, which also couples to a number of other DRAM CAM cells (not shown) to form a row of a CAM device, is initially pre-charged to a logic one by pre-charge circuit 919. An unmasked match or a masked mismatch causes the match line to remain at the logic one level. In response to an unmasked mismatch, however, match transistor 914 of compare circuit 904 and masking circuit 906 couple the match line to ground potential, thereby allowing discharge of the match line to a logic zero level. A sense amp 920 couples to the match line to detect the logic state of the match line, but the embodiment is not so limited.

Figure 10:
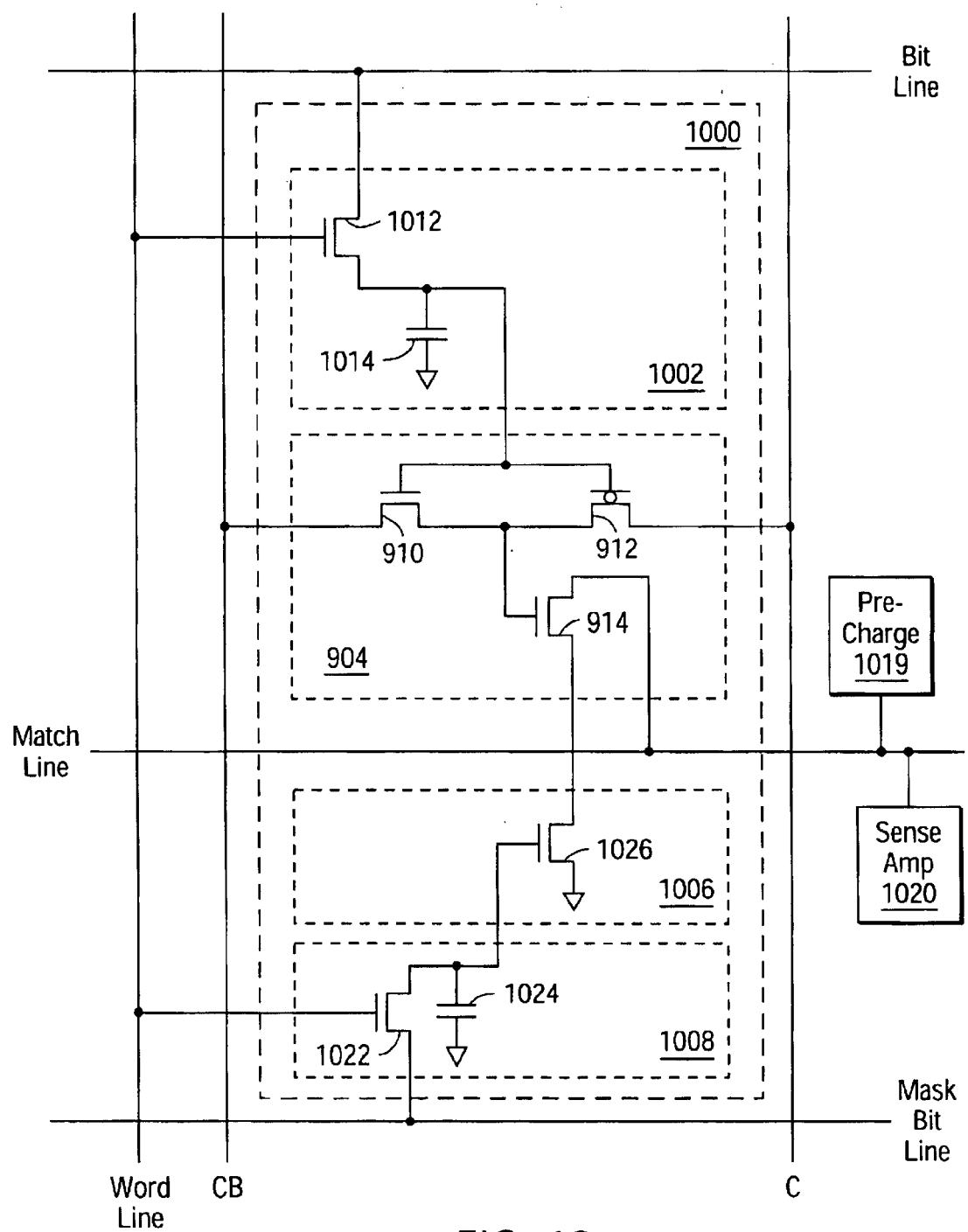
FIG. 10 is a block diagram of a ternary DRAM CAM cell including a compare circuit, under the embodiment of FIG. 9.

FIG. 10 is a block diagram of a ternary DRAM CAM cell 1000 including a compare circuit 904, under the embodiment of FIG. 9. The ternary DRAM CAM cell 1000 includes memory cell 1002, masking circuit 1006, and masking cell 1008, which are exemplary embodiments of memory cell 902, masking circuit 906, and masking cell 908. Various alternative embodiments of the ternary DRAM CAM cell 1000 can include other types and combinations of circuitry as substitutes for these exemplary embodiments.

Memory cell 1002 is a DRAM cell including one transistor 1012 and a single storage device 1014. The transistor 1012 of an embodiment is an n-channel or NMOS transistor, but alternative embodiments can use various other types of transistors. The storage device 1014 of an embodiment is a capacitor coupled among the drain (source) of transistor 1012 and the gates of n-channel or NMOS transistor 910 and PMOS transistor 912 of the compare circuit 904. The source (drain) of transistor 1012 is coupled to the bit line while the gate of transistor 1012 is coupled to the word line. The writing of data to and the reading of data from the capacitor 1014 is performed by charge transfer through the bit line and transistor 1012 in response to the logical state of the word line.

Masking cell 1008 is a DRAM cell including one transistor 1022 and a single storage device or cell 1024. The transistor 1022 of an embodiment is an n-channel or NMOS transistor, but alternative embodiments can use various other types of transistors. The storage device 1024 of an embodiment is a capacitor coupled among the drain (source) of transistor 1022 and the masking circuit 1006. The source (drain) of transistor 1022 is coupled to the mask bit line while the gate of transistor 1022 is coupled to the word line. The writing of data to and the reading of data from the capacitor 1024 is performed by charge transfer through the mask bit line and transistor 1022 in response to the logical state of the word line.

Masking circuit 1006 includes a mask control transistor 1026 or pass transistor. Transistor 1026 of an embodiment is an NMOS transistor, but alternative embodiments can use various other types or combinations of transistors or circuits as substitutions. Local mask data of the storage device 1024 controls the gate, and thus the conducting state, of mask control transistor 1026. The source (drain) of mask control transistor 1026 is coupled to the drain (source) of match transistor 914 of compare circuit 904. The drain (source) of mask control transistor 1026 is coupled to ground potential. When the local mask data is a logic one indicating a mask condition, mask control transistor 1026 is on or conducting such that the compare results generated by compare circuit 904 control the logical state of the match line. When, however, the local mask data is a logic zero indicating a non-mask condition, mask control transistor 1026 is off or non-conducting such that compare results generated by compare circuit 904 do not affect the logical state of the match line.

The truth table for the operation of ternary DRAM CAM cell 1000 is shown in Table 3

TABLE 3

| C | CB | Cell 1002 | MASK | Match Line |
|---|----|-----------|------|------------|
| 0 | 1  | 0         | 1    | 1          |
| 0 | 1  | 1         | 1    | 0          |

TABLE 3-continued

| C | CB | Cell 1002 | MASK | Match Line |
|---|----|-----------|------|------------|
| 1 | 0  | 0         | 1    | 0          |
| 1 | 0  | 1         | 1    | 1          |
| 0 | 1  | 0         | 0    | 1          |
| 0 | 1  | 1         | 0    | 1          |
| 1 | 0  | 0         | 0    | 1          |
| 1 | 0  | 1         | 0    | 1          |

With reference to the first row of the truth table of Table 3 and FIG. 10, the operation of ternary DRAM CAM cell 1000 is as follows. The memory cell 1002 stores a logic zero. Also, the mask data is a logic one which places transistor 1026 in a conducting state and disables the mask thereby allowing the compare circuit 904 to control the logic state of the match line.

The logic zero state of the data of the memory cell 1002 places PMOS transistor 912 in a conducting state and NMOS transistor 910 in a non-conducting state. With PMOS transistor 912 in a conducting state the logic zero of compare signal C is applied to the gate of match transistor 914, placing match transistor 914 in a non-conducting state. The non-conducting state of match transistor 914 causes the match line to remain pre-charged to a logic one, thus indicating a match between the data stored in the memory cell 1002 and the comparand data.

Referring to the second row of the truth table of Table 3, the memory cell 1002 stores a logic one and, again, the mask data is a logic one which disables the mask and allows the compare circuit 904 to control the logic state of the match line. The logic one stored in the memory cell 1002 and applied to the gates of transistors 910 and 912 places NMOS transistor 910 in a conducting state and PMOS transistor 912 in a non-conducting state. With NMOS transistor 910 in a conducting state the logic one compare signal CB controls the gate of match transistor 914, placing match transistor 914 in a conducting state. The conducting state of match transistor 914 provides a path between the match line and ground potential. Thus, the match line discharges to a logic zero via the path to ground potential to indicate a mismatch condition between the data stored in the memory cell 1002 and the comparand data.

Referring to the third row of the truth table of Table 3, the memory cell 1002 5 stores a logic zero. The logic zero state of the data of the memory cell 1002 places PMOS transistor 912 in a conducting state and NMOS transistor 910 in a non-conducting state. With PMOS transistor 912 in a conducting state the logic one of compare signal C is applied to the gate of match transistor 914, placing match transistor 914 in a conducting state. The conducting state of match transistor 914 provides a path between the match line and ground potential, allowing the match line to discharge to a logic zero via the path to ground potential, thereby indicating a mismatch condition between the data stored in the memory cell 1002 and the comparand data.

Referring to the fourth row of the truth table of Table 3, the memory cell 1002 stores a logic one and, again, the mask data is a logic one which disables the mask and allows the compare circuit 904 to control the logic state of the match line. The logic one stored in the memory cell 1002 and applied to the gates of transistors 910 and 912 places NMOS transistor 910 in a conducting state and PMOS transistor 912 in a non-conducting state. With NMOS transistor 910 in a conducting state the logic zero compare signal CB controls the gate of match transistor 914, placing match transistor 914 in a non-conducting state. The non-conducting state of match transistor 914 causes the match line to remain precharged to a logic one, thus indicating a match between the data stored in the memory cell 1002 and the comparand data.

The fifth through eighth rows of the truth table of Table 3 describe the operation of the DRAM CAM cell 1000 when the compare results are masked. The active mask, as controlled by the logic zero mask value, places transistor 1026 in a non-conducting state, thereby preventing the establishment of any conducting path between the match line and ground potential regardless of the results of the compare operation. As such, the result of the compare operation is masked so that the match line remains at the pre-charged state and indicates a match regardless of the results of the compare operation.

An alternative to the ternary DRAM CAM cell 1000 includes a binary DRAM CAM cell. The binary DRAM CAM cell, with reference to FIG. 10 includes the memory cell 1002 and the compare circuit 1004. The binary DRAM CAM cell does not, however, include the masking circuit 1006 and the masking cell 1008. Instead, the binary DRAM CAM cell couples the drain (source) of match transistor 914 to ground potential.

Various alternative embodiments of the DRAM CAM cells described above may write data to or read data from the DRAM CAM cell using any number/combination of bit lines. Likewise, alternative embodiments may provide data and comparand data to the CAM cell using any number/combination of multiplexed bit lines and compare signal lines.

The DRAM CAM cells described above may be fabricated such that the DRAM storage elements (e.g., memory cells 102, 502, 702, and 1002 and the masking cells 108, 508, 708, and 1008) are low leakage current storage elements. By reducing the leakage current, charge can be retained in the storage elements for a longer period of time and also improve reliability of the storage elements. Leakage current in the cells can be achieved, for example, by increasing the transistor threshold voltages with the memory cells, but this also tends to slow the switching speed of the transistors. The slower switching speed may be undesirable in the compare circuit if all similar type (i.e., NMOS or PMOS) transistors are manufactured to have the same threshold voltages. Thus, the transistors in the memory cells and the transistors in the compare circuit may be designed to have different threshold voltages. One non-exhaustive example of such an embodiment for DRAM CAM cell 1000 is shown in FIG. 11.

Figure 11:
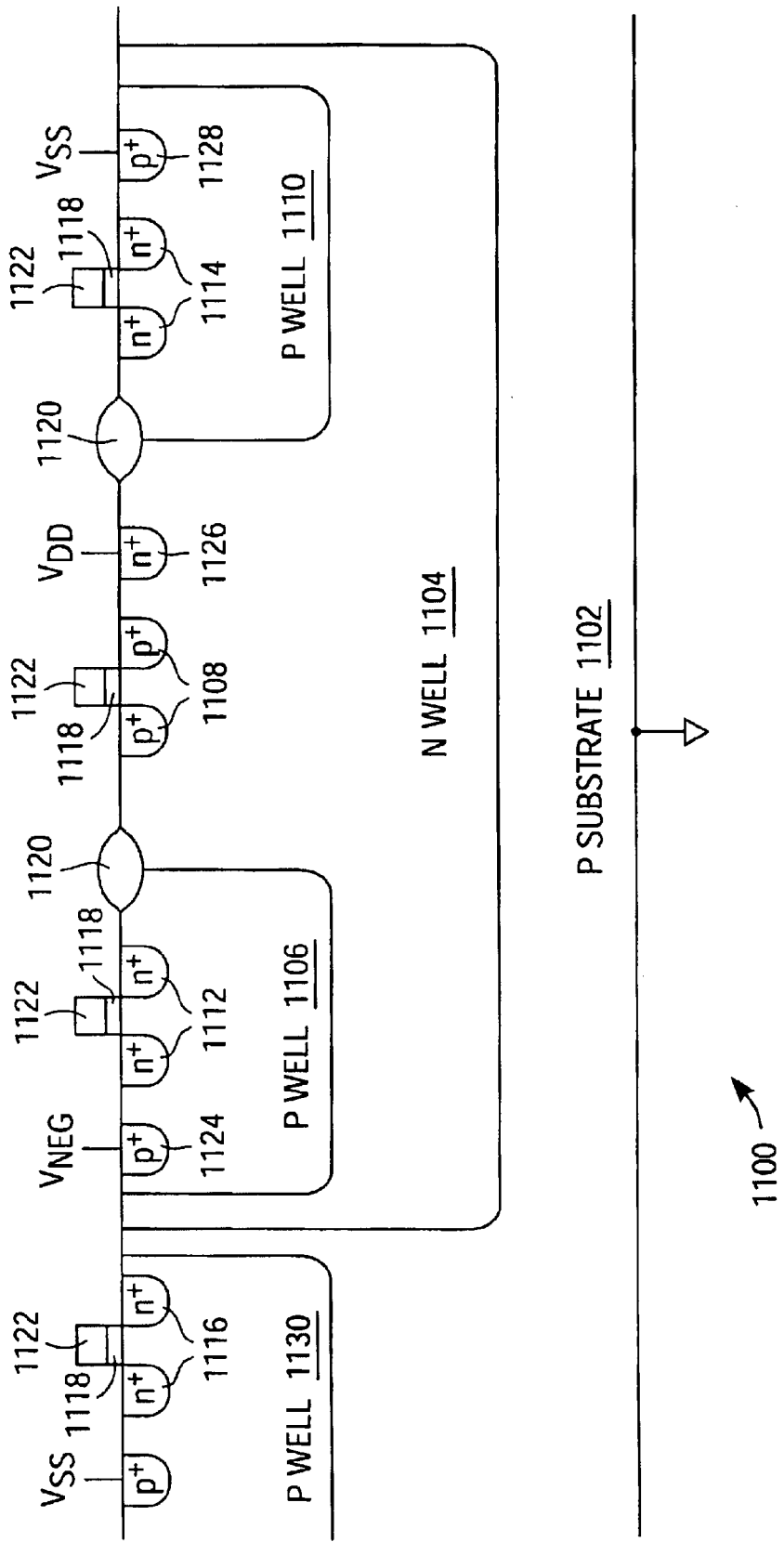
FIG. 11 is a sectional view of a PMOS-based DRAM CAM cell semiconductor device using triple-well process technology, under the embodiment of FIG. 10.

FIG. 11 is a simplified sectional view of DRAM CAM cell 1100 that is one embodiment of DRAM CAM cell 1000 of FIG. 10. Note that this sectional view does not interconnect all of the transistors or show all of the process steps typically used to form transistors, which one of ordinary skill in the art can readily determine; rather, it shows how the various transistors are disposed in different conductive wells to achieve one embodiment of transistors of similar type having different threshold voltages.

The DRAM CAM cell 1100 includes a semiconductor substrate 1102 of a p conductivity type, or p substrate. The p substrate is coupled to ground potential, or $V_{SS}$, but is not so limited. A first n conductivity type well 1104, or n well, is disposed in the p substrate 1102. The first n well 1104 is coupled to a potential $V_{DD}$ by n+well contact 1126. The DRAM CAM cell 1000 is formed in n well 1104, while transistors forming other circuitry are formed outside of n well 1104 (e.g., in p well 1130 or other n wells). PMOS transistors (e.g., such as PMOS transistor 912 of FIG. 10) have a source region and a drain region 1108 of p-type material, gate insulator 1118, and gate electrode 1122 are formed in the n well 1104.

Two p conductivity type wells 1106 and 1110, or p wells, are disposed in the n well 1104. Isolation 1120 (e.g., Shallow Trench Isolation (STI) or other isolation) is used to isolate the p wells 1106 and 1110 with respect to each other. NMOS transistors (e.g., such as NMOS transistors 910, 914, and 1026 of FIG. 10) are disposed in p well 1110, and each have a source region and a drain region 1114 of n-type material, gate insulator 1118, and gate electrode 1122. P well 1110 is coupled to $V_{SS}$ by p well contact 1128. NMOS transistors (e.g., such as NMOS transistors 1012 and 1022 of FIG. 10) are disposed in p well 1106, and each have a source region and a drain region 1112 of n-type material, gate insulator 1118, and gate electrode 1122. P well 1106 is coupled to $V_{NEG}$ by p well contact 1124. The potential $V_{NEG}$ of an embodiment is lower than ground potential such that the threshold voltage for these transistors associated with the DRAM storage elements is higher than that of the NMOS transistors disposed in p well 1110 (and thus have lower leakage current). For one embodiment, $V_{NEG}$ is approximately in the range from −0.2 volts to −0.5 volts, but is not so limited.

Figure 12:
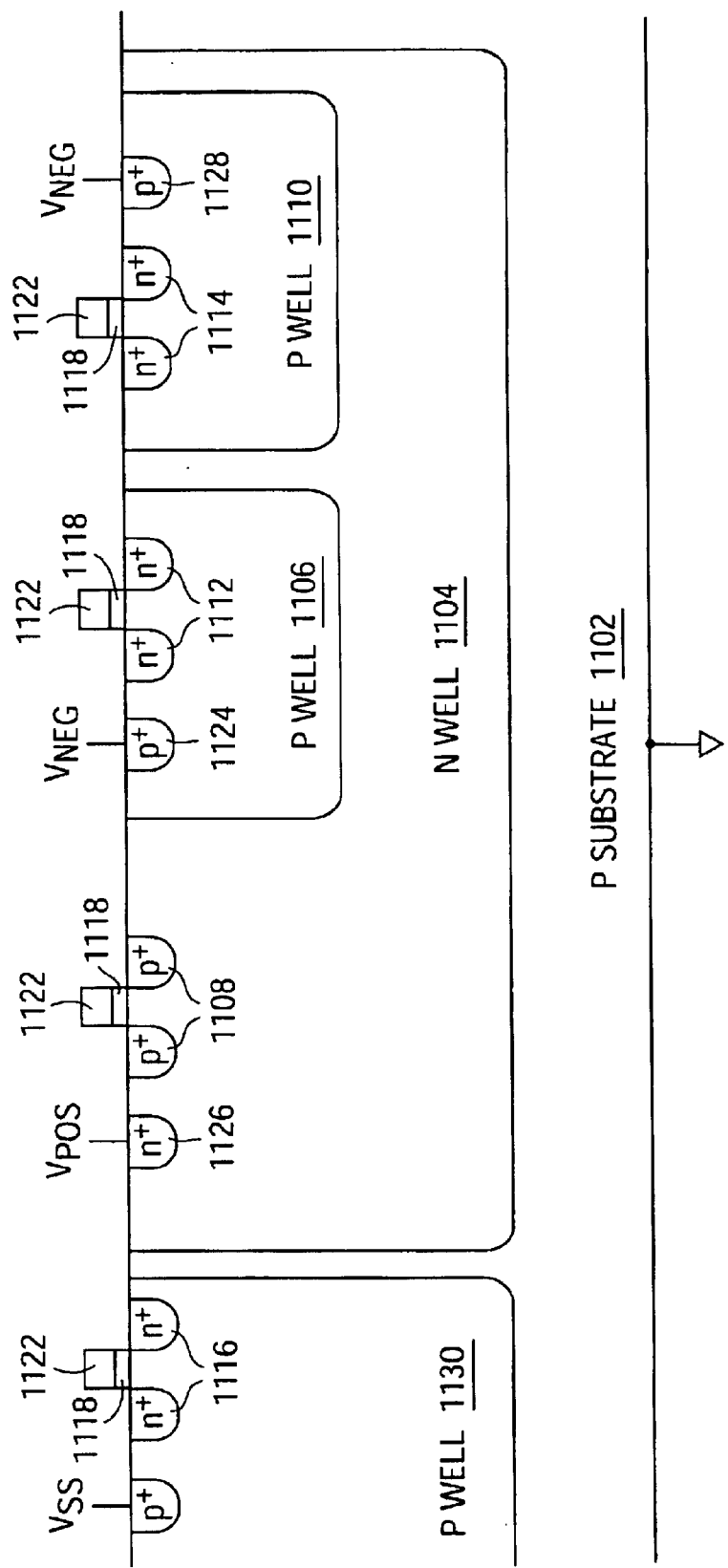
FIG. 12 is a sectional view of a PMOS-based DRAM CAM cell semiconductor device using triple-well process technology, under an alternative embodiment of FIG. 11.

Note that p wells 1106 and 1110 do not necessarily need to have PMOS transistors disposed between them (as shown in FIG. 12). Various other alternative arrangements are possible.

Figure 13:
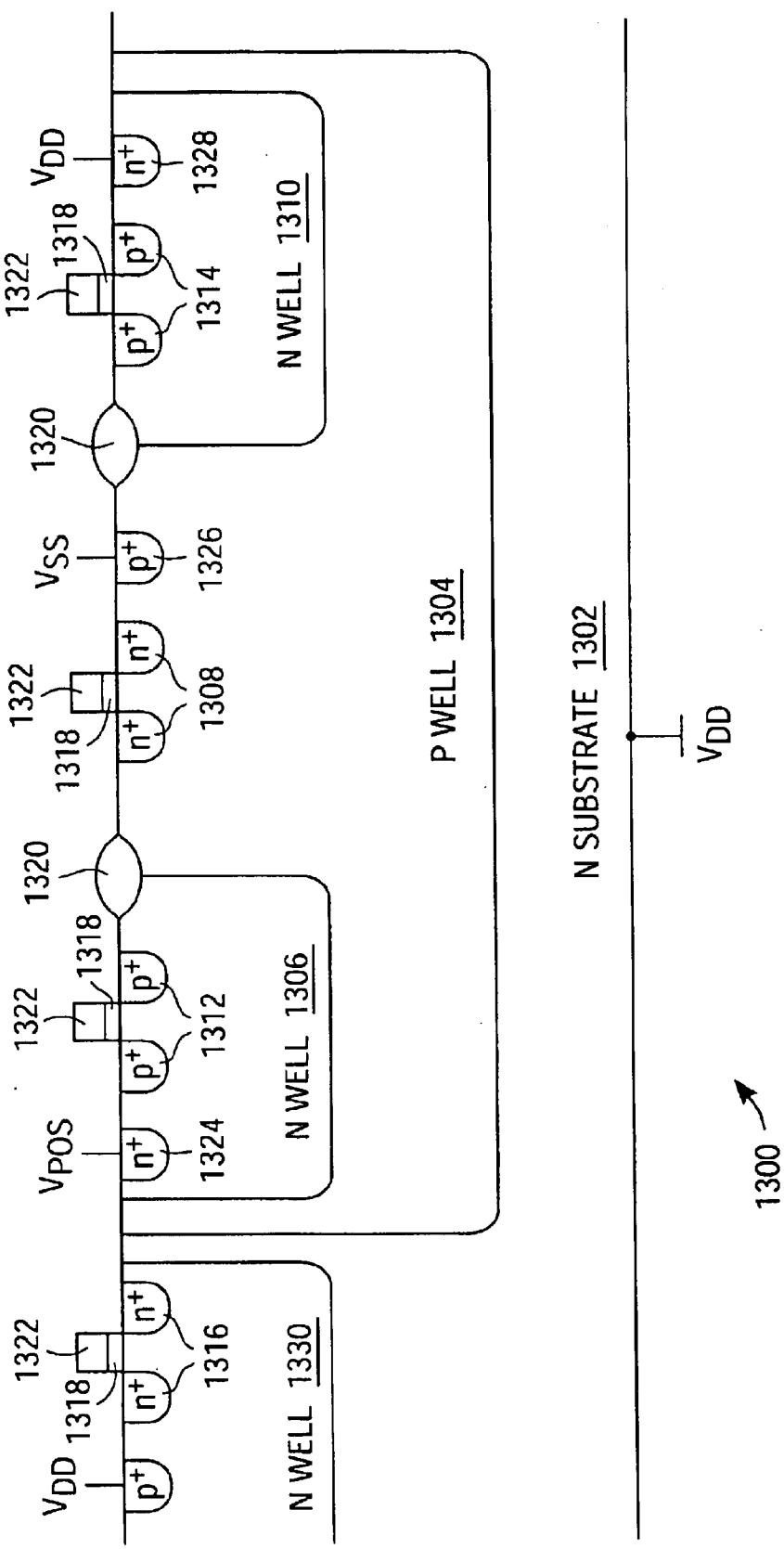
FIG. 13 is a sectional view of a PMOS-based DRAM CAM cell semiconductor device, under another alternative embodiment of FIG 11.

Also note that in other embodiments, the substrate material can be of n-type material as shown, for example, in FIG. 13. FIG. 13 is a simplified sectional view of a DRAM CAM cell 1300. Note that this sectional view does not interconnect all of the transistors or show all of the process steps typically used to form transistors, which one of ordinary skill in the art can readily determine; rather, it shows how the various transistors are disposed in different conductive wells to achieve one embodiment of transistors of similar type having different threshold voltages.

The DRAM CAM cell 1300 includes a semiconductor substrate 1302 of n conductivity type, or n substrate. The n substrate is coupled to VDD, but is not so limited. A first p conductivity type well 1304, or p well, is disposed in the n substrate 1302. The first p well 1304 is coupled to a potential VSS by p+ well contact 1326. The DRAM CAM cell 1300 is formed in p well 1304, while transistors forming other circuitry are formed outside of p well 1304 (e.g., in n well 1330 or other n wells). NMOS transistors have a source region and a drain region 1308 of n-type material, gate insulator 1318, and gate electrode 1322 are formed in the p well 1304.

Two n conductivity type wells 1306 and 1310, or n wells, are disposed in the p well 1304. Isolation 1320 (e.g., Shallow Trench Isolation (STI) or other isolation) is used to isolate the n wells 1306 and 1310 with respect to each other. PMOS transistors are disposed in n well 1310, and each has a source region and a drain region 1314 of p-type material, gate insulator 1318, and gate electrode 1322. N well 1310 is coupled to VDD by n well contact 1328. PMOS transistors are disposed in n well 1306, and each has a source region and a drain region 1312 of p-type material, gate insulator 1318, and gate electrode 1322. N well 1306 is coupled to $V_{POS}$ by n well contact 1324. The potential $V_{POS}$ of an embodiment is larger than $V_{DD}$ such that the threshold voltage for these transistors associated with the DRAM storage elements is higher than that of the PMOS transistors disposed in n well 1310 (and thus have lower leakage current).

Figure 14:
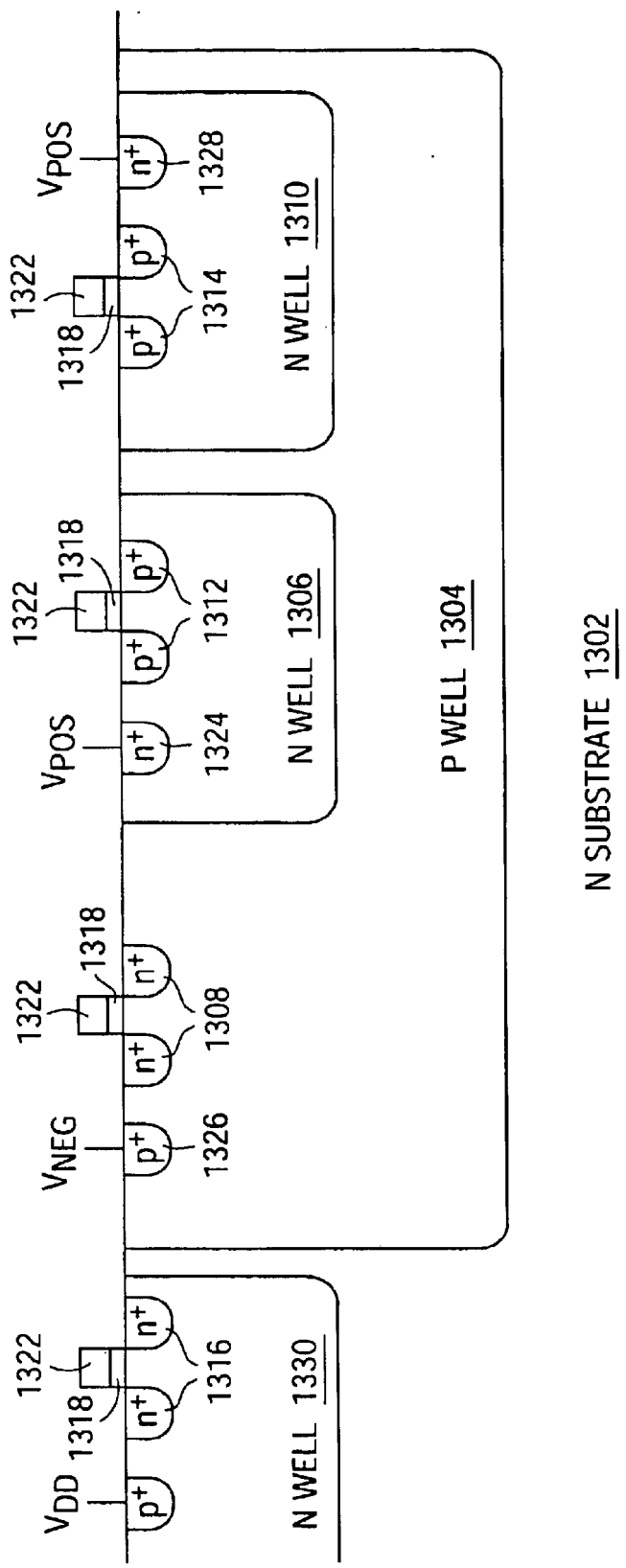
FIG. 14 is a sectional view of a PMOS-based DRAM CAM cell semiconductor device, under an alternative embodiment of FIG. 13.

Note that n wells 1306 and 1310 do not necessarily need to have NMOS transistors disposed between them (as shown in FIG. 14). Various other alternative arrangements are possible.

Figure 15:
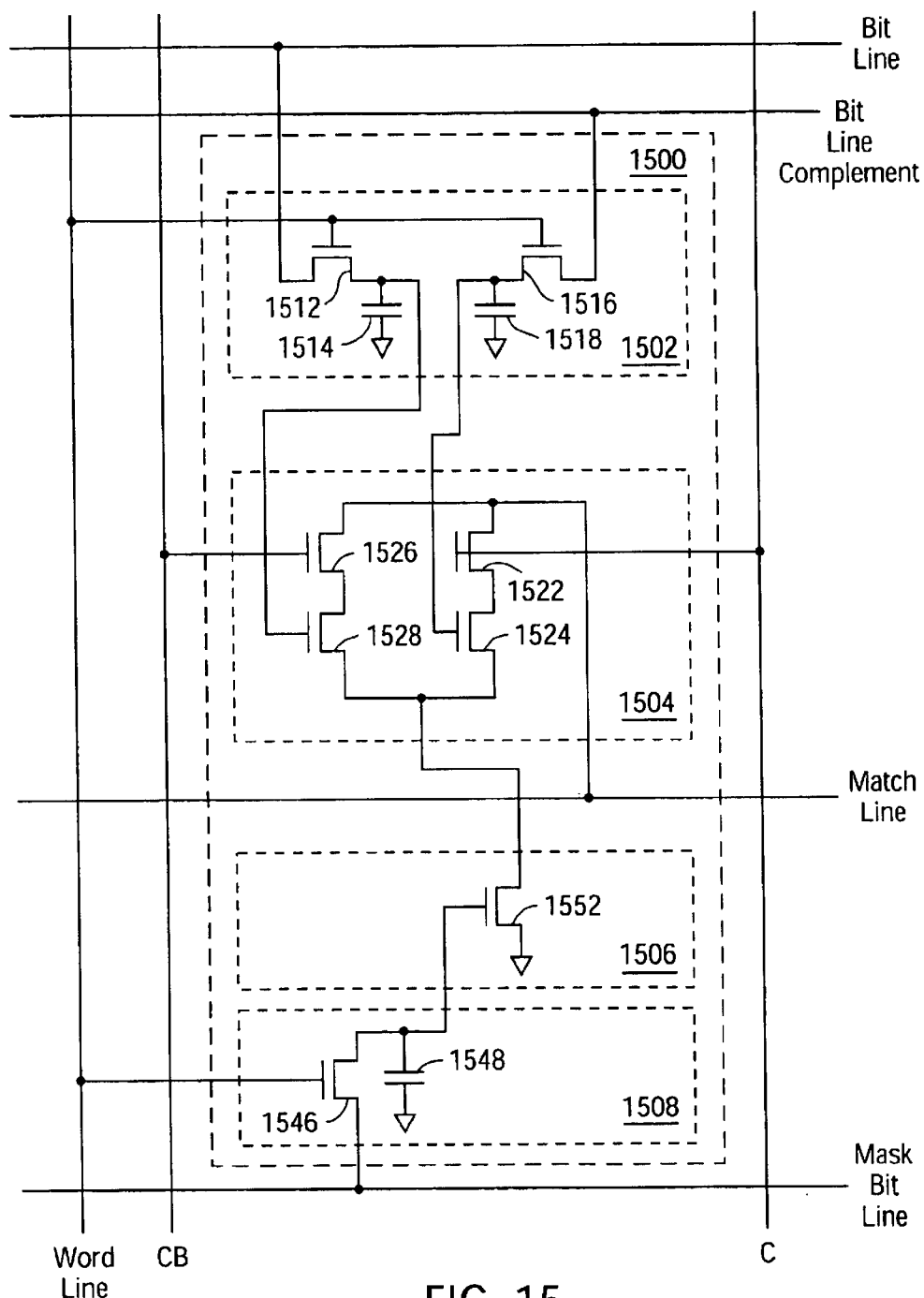
FIG. 15 is a ternary DRAM CAM cell including an n-channel transistor compare circuit, under an alternative embodiment.

FIG. 15 is a ternary DRAM CAM cell 1500 including an n-channel transistor compare circuit 1504, under an alternative embodiment. Ternary DRAM CAM cell 1500 further includes memory cell 1502, masking circuit 1506, and masking cell 1508. The memory cell 1502 is a DRAM cell including one transistor 1512 and capacitor 1514 coupled to store data and another transistor 1516 and capacitor 1518 combination coupled to store complement data. The transistors 1512 and 1516 of an embodiment are NMOS transistors, but alternative embodiments can use various other types of transistors. The source (drain) of transistor 1512 is coupled to the bit line while the source (drain) of transistor 1516 is coupled to the complement bit line; the gates of transistors 1512 and 1516 are coupled to the word line. The writing of data to and the reading of data from the capacitors 1514 and 1518 is performed by charge transfer through the bit line BL and complement bit line BLB, respectively, in response to the logical state of the word line.

Compare circuit 1504 compares the data stored in memory cell 1502 with comparand data provided on compare signal lines C and CB. Compare circuit 1504 includes NMOS transistors 1522, 1524, 1526, and 1528 coupled to perform the comparison function. Transistors 1522 and 1524 are coupled in series to form a first path through the compare circuit 1504, and transistors 1526 and 1528 are coupled in series to form a second path through the compare circuit. The sources (drains) of transistors 1522 and 1526 are coupled to the match line, while the drains (sources) of transistors 1524 and 1528 are coupled to the masking circuit 1506. The capacitor 1514 couples to control the gate of transistor 1528 using the stored data of the memory cell 1502 while the capacitor 1518 couples to control the gate of transistor 1524 using the stored complement data of the memory cell 1502. The compare signals C and CB couple to control the gates of transistors 1522 and 1526, respectively.

Masking cell 1508 is a DRAM cell including one transistor 1546 and a single storage device or cell 1548. The transistor 1546 of an embodiment is an n-channel or NMOS transistor, but alternative embodiments can use various other types of transistors. The storage device 1548 of an embodiment is a capacitor coupled among the drain (source) of transistor 15146 and the masking circuit 1506. The source (drain) of transistor 1546 is coupled to the mask bit line while the gate of transistor 1546 is coupled to the word line. The writing of data to and the reading of data from the capacitor 1548 is performed by charge transfer through the mask bit line and transistor 1546 in response to the logical state of the word line.

Masking circuit 1506 includes a mask control transistor 1552 or pass transistor. Transistor 1552 of an embodiment is an NMOS transistor, but alternative embodiments can use various other types or combinations of transistors or circuits as substitutions. Local mask data of the storage device 1548 controls the gate, and thus the conducting state, of mask control transistor 1552. The source (drain) of mask control transistor 1552 is coupled to the drains (sources) of transistors 1524 and 1528 of compare circuit 1504. The drain (source) of mask control transistor 1552 is coupled to ground potential. When the local mask data is a logic one indicating a non-mask condition, mask control transistor 1552 is on or conducting such that the compare results generated by compare circuit 1504 control the logical state of the match line. When, however, the local mask data is a logic zero indicating a mask condition, mask control transistor 1552 is off or non-conducting such that the compare results generated by compare circuit 1504 do not affect the logical state of the match line.

An alternative embodiment of the ternary DRAM CAM cell 1500 includes multiplexed data and comparand data signal lines. In this alternative, a multiplexed bit line transfers both data and compare data on a single line, according to a pre-specified multiplexing scheme. This effectively combines the functions of the bit line and the compare signal line C into one multiplexed bit line. Likewise, a multiplexed complement bit line carries both complement data and complement compare data on a single line, effectively combining the functions of the complement bit line and the complement compare signal line CB into one multiplexed bit line.

Another alternative to the ternary DRAM CAM cell 1500 includes a binary DRAM CAM cell. The binary DRAM CAM cell, referring to FIG. 15, includes the memory cell 1502 and the compare circuit 1504. The binary DRAM CAM cell does not, however, include the masking circuit 1506 and the masking cell 1508. Instead, the binary DRAM CAM cell couples the drains (sources) of transistors 1524 and 1528 to ground potential.

The underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc. Furthermore, aspects of the invention may be implemented as functionality programmed into any of a variety of circuitry, including programmable logic devices (PLDs), such as field programmable gate arrays (FPGAs), programmable array logic (PAL) devices, electrically programmable logic, as well as application specific integrated circuits (ASICs).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," and words of similar import, when used in this application, shall refer to this application as a whole and not to any particular portions of this application.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other memory devices and systems, not only for the CAM cells described above.

The elements and acts of the various embodiments described above can be combined to provide further embodiments. These and other changes can be made to the invention in light of the above detailed description.

In general, in the following claims, the terms used should not be construed to limit the invention to the specific embodiments disclosed in the specification and the claims, but should be construed to include all memory-based systems that operate under the claims. Accordingly, the invention is not limited by the disclosure, but instead the scope of the invention is to be determined entirely by the claims.

While certain aspects of the invention are presented below in certain claim forms, the inventor contemplates the various aspects of the invention in any number of claim forms. Accordingly, the inventors reserve the right to add additional claims after filing the application to pursue such additional claim forms for other aspects of the invention.

What I claim is:

1. A ternary content addressable memory (CAM) cell comprising:
   a dynamic random access memory (DRAM) cell for storing a data value;
   a masking circuit coupled to receive a local mask value stored in a DRAM masking cell;
   a compare circuit coupled among the DRAM cell and the masking circuit to receive first and second signal sets and affect a logical state of a match line in response to a predetermined logical relationship between the first and second signal sets, the compare circuit including a first pair of transistors coupled for conduction state control by the first signal set and a second pair of transistors coupled for conduction state control by the second signal set, the first pair of transistors including n-channel transistors and the second pair of transistors including one n-channel transistor and one p-channel transistor.

2. The ternary CAM cell of claim 1, wherein the first signal set includes comparand data.

3. The ternary CAM cell of claim 1, wherein the second signal set includes the data value.

4. The ternary CAM cell of claim 1, wherein:
   the masking circuit receives comparand data and provides the comparand data to the compare circuit as the first signal set in response to the comparand data and the mask value being in a predetermined logical relationship; and
   the second signal set includes the data value.

5. The ternary CAM cell of claim 1, wherein the masking circuit includes a first pair and a second pair of transistors coupled for conduction state control by the mask value, the first pair of transistors being p-channel transistors coupled to receive comparand data, the second pair of transistors being n-channel transistors.

6. The ternary CAM cell of claim 1, wherein:
   the first signal set includes comparand data; and
   the masking circuit receives the data value from the memory cell and couples the data value to the compare circuit as the second signal set in response to the data value and the mask value being in a predetermined logical relationship.

7. The ternary CAM cell of claim 1, wherein the masking circuit includes a first pair of p-channel transistors coupled in series with a second pair of n-channel transistors, wherein conduction states of the first and second pair of transistors are controlled by the mask value.

8. The ternary CAM cell of claim 1, wherein a pre-charge circuit coupled to the match line presets the logical state of the match line.

9. The ternary CAM cell of claim 1, wherein a sense amplifier coupled to the match line detects two or more logical states of the match line.

10. The ternary CAM cell of claim 1, further comprising a bit line coupled to the DRAM cell over which the data value is written to and read from the DRAM cell.

11. The ternary CAM cell of claim 1, further comprising a mask bit line coupled to the masking DRAM cell over which the mask value is written to and read from the masking DRAM cell.

12. The ternary CAM cell of claim 1, further comprising a word line coupled to the DRAM cell and the masking DRAM cell.

13. A content addressable memory (CAM) cell comprising:
   a dynamic random access memory (DRAM) cell for storing a data value;
   a compare circuit coupled to affect a logical state of a match line in response to the data value and comparand data from compare signal lines being in a predetermined logical relationship, the compare circuit including a first pair of transistors coupled for conduction state control by the comparand data and a second pair of transistors coupled for conduction state control by the data value, the first pair of transistors including n-channel transistors and the second pair of transistors including one n-channel transistor and one p-channel transistor.

14. The CAM cell of claim 13, further comprising a masking circuit including a masking cell coupled to the compare circuit, the masking circuit controlling the ability of the compare circuit to affect a logical state of the match line in response to a mask value stored in the masking cell.

15. The CAM cell of claim 13, further comprising a sense amplifier coupled to the match line to detect two or more logical states of the match line.

16. A content addressable memory (CAM) cell comprising a compare circuit coupled to control a potential of a match line in response to a predetermined logical relationship between a signal representative of a received data value and at least one signal representative of comparand data, the compare circuit including first and second paths coupled to control the potential, the first path including an n-channel transistor coupled for conduction state control by a first signal representative of comparand data and an n-channel transistor coupled for conduction state control by the data value, the second path including an n-channel transistor coupled for conduction state control by a second signal representative of comparand data and a p-channel transistor coupled for conduction state control by the data value.

17. The CAM cell of claim 16, further comprising a sense amplifier coupled to the match line to detect changes in the logical state of the match line.

18. A ternary content addressable memory (CAM) cell comprising:
   a first dynamic random access memory (DRAM) cell for storing data;
   a second DRAM cell coupled to a mask circuit for storing mask data;
   a compare circuit coupled among the first DRAM cell and the mask circuit, including a pair of transistors coupled in series to selectively receive comparand data from a pair of signal lines in response to conduction state control by the data, and further including an n-channel match transistor coupled between a match line and the mask circuit, wherein the pair of transistors include a p-channel transistor and an n-channel transistor that control the conduction state of the match transistor to affect a potential of the match line in response to a predetermined logical relationship between the data, the comparand data, and the mask data.

19. The ternary CAM cell of claim 18, further comprising a sense amplifier coupled to the match line to detect two or more logical states of the match line.

20. A method of operating a content addressable memory (CAM) device, comprising:

setting the logical state of a match line at a first potential value;

controlling a conduction state of a first transistor in each of two match line couplings to a node having a second potential value in response to received data, the first transistor of a first match line coupling being an n-channel transistor and the first transistor of a second match line coupling being a p-channel transistor;

controlling a conduction state of a second transistor in each of the two match line couplings to the node in response to received comparand data, the second transistors being n-channel transistors; and controlling the logical state of the match line between the first and second potential values in response to the conduction states of the first and second transistors in the two match line couplings as determined by a predetermined logical relationship between the received data and comparand data.

21. A method of operating a content addressable memory (CAM) cell comprising:

writing data to a memory cell;

comparing comparand data with the memory cell data to generate a comparison result, the comparison including affecting a potential of a match line via charge control paths in response to a logical relationship between the memory cell data and the comparand data, a first charge control path including an n-channel transistor coupled for conduction state control by signals representative of the comparand data and an n-channel transistor coupled for conduction state control by signals representative of the memory cell data, a second charge control path including an n-channel transistor coupled for conduction state control by signals representative of the comparand data and a p-channel transistor coupled for conduction state control by signals representative of the memory cell data; and writing mask data to a second memory cell to mask the comparison result from affecting the logical state of the match line.

* * * * *